United States Patent

Sim et al.

(10) Patent No.: US 9,196,859 B2
(45) Date of Patent: Nov. 24, 2015

(54) ORGANIC LIGHT-EMITTING DEVICE

(71) Applicants: Joong-Won Sim, Yongin (KR);
Kwan-Hee Lee, Yongin (JP);
Byung-Hoon Chun, Yongin (KR)

(72) Inventors: Joong-Won Sim, Yongin (KR);
Kwan-Hee Lee, Yongin (JP);
Byung-Hoon Chun, Yongin (KR)

(73) Assignee: SAMSUNG DISPLAY CO., LTD.,
Yongin, Gyeonggi-do (KR)

(*) Notice: Subject to any disclaimer, the term of this patent is extended or adjusted under 35 U.S.C. 154(b) by 73 days.

(21) Appl. No.: 14/101,544

(22) Filed: Dec. 10, 2013

(65) Prior Publication Data

US 2014/0367653 A1   Dec. 18, 2014

(30) Foreign Application Priority Data

Jun. 12, 2013  (KR) .................. 10-2013-0067325

(51) Int. Cl.
*H01L 51/52* (2006.01)
*H01L 51/50* (2006.01)

(52) U.S. Cl.
CPC ........ *H01L 51/5096* (2013.01); *H01L 51/5024* (2013.01); *H01L 51/506* (2013.01); *H01L 51/5076* (2013.01)

(58) Field of Classification Search
CPC .................................................. H01L 51/5203
See application file for complete search history.

(56) References Cited

U.S. PATENT DOCUMENTS

| | | | |
|---|---|---|---|
| 2004/0100190 A1* | 5/2004 | Kim et al. | 313/504 |
| 2008/0118775 A1 | 5/2008 | Kim et al. | |
| 2009/0033212 A1* | 2/2009 | Ahn et al. | 313/504 |
| 2014/0103301 A1* | 4/2014 | Lee et al. | 257/40 |
| 2014/0124753 A1* | 5/2014 | Lee et al. | 257/40 |

FOREIGN PATENT DOCUMENTS

| | | |
|---|---|---|
| KR | 10-0830976 B1 | 5/2008 |
| KR | 10 2009-0097464 A | 9/2009 |
| KR | 10 2011-0083541 A | 7/2011 |

* cited by examiner

*Primary Examiner* — Lex Malsawma
(74) *Attorney, Agent, or Firm* — Lee & Morse, P.C.

(57) ABSTRACT

An organic light-emitting device and a flat panel device, the organic light-emitting device including a first electrode; a second electrode; and an organic layer between the first electrode and the second electrode, wherein the organic layer includes an emission layer, the emission layer including at least one N-doping layer.

20 Claims, 2 Drawing Sheets

ORGANIC LIGHT-EMITTING DEVICE

CROSS-REFERENCE TO RELATED APPLICATION

Korean Patent Application No. 10-2013-0067325, filed on Jun. 12, 2013, in the Korean Intellectual Property Office, and entitled: "Organic Light-Emitting Device," is incorporated by reference herein in its entirety.

BACKGROUND

1. Field

Embodiments relate to an organic light-emitting device.

2. Description of the Related Art

Organic light-emitting devices (OLEDs), which are self-emitting devices, may have advantages such as wide viewing angles, excellent contrast, quick response, high brightness, and excellent driving voltage characteristics, and may provide multicolored images.

An OLED may have a structure including, e.g., a substrate, an anode disposed on the substrate, and a hole transport layer (HTL), an emission layer (EML), an electron transport layer (ETL), and a cathode, which are sequentially stacked on the anode. In this regard, the HTL, the EML, and the ETL are organic thin films formed of organic compounds.

An operating principle of an OLED having the above-described structure is as follows.

When a voltage is applied between the anode and the cathode, holes injected from the anode may move to the EML via the HTL, and electrons injected from the cathode may move to the EML via the ETL. The holes and electrons may recombine in the EML to generate excitons. When the excitons drop from an excited state to a ground state, light may be emitted.

SUMMARY

Embodiments are directed to an organic light-emitting device.

The embodiments may be realized by providing an organic light-emitting device including a first electrode; a second electrode; and an organic layer between the first electrode and the second electrode, wherein the organic layer includes an emission layer, the emission layer including at least one N-doping layer.

The organic layer may further include an electron transport layer, the at least one N-doping layer contacting the electron transport layer.

The organic layer may further include an electron transport layer and a hole transport layer, the emission layer may include two N-doping layers, one of the N-doping layers may contact the electron transport layer, and another N-doping layer may be in the emission layer.

The emission layer may include a host and a dopant, the dopant of the emission layer being the same as a dopant of the at least one N-doping layer.

The emission layer may include a host and a dopant, the dopant of the emission layer being different from a dopant of the at least one N-doping layer.

A dopant of the at least one N-doping layer may include a boron-based compound.

A dopant of the at least one N-doping layer may include lithium quinolate.

The at least one N-doping layer may have a thickness of about 20 Å to about 100 Å.

The organic layer may include the emission layer and further includes a hole injection layer, a hole transport layer, or a functional layer having both hole injection and hole transport capabilities, and the emission layer may include red, green, blue, and white emission layers, one of which includes a phosphorescent compound.

At least one of the hole injection layer, the hole transport layer, or the functional layer having both hole injection and hole transport capabilities may include a charge-generating material.

The charge-generating material may include a p-type dopant.

The p-type dopant may include a quinone derivative.

The p-type dopant may include a metal oxide.

The p-type dopant may include a cyano group-containing compound.

The organic layer may further include an electron transport layer, the electron transport layer including an electron transporting organic compound and a metal complex.

The metal complex may include a lithium complex.

The metal complex may include lithium quinolate.

The metal complex may include a complex represented by Compound 203, below:

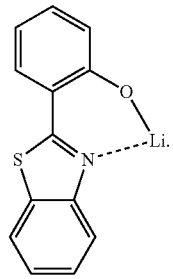

<Compound 203>

The organic layer may be formed using a wet process.

The embodiments may be realized by providing a flat panel display device comprising the organic light-emitting device according to an embodiment, wherein the first electrode of the organic light-emitting device is electrically connected to a source electrode or a drain electrode of a thin-film transistor.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
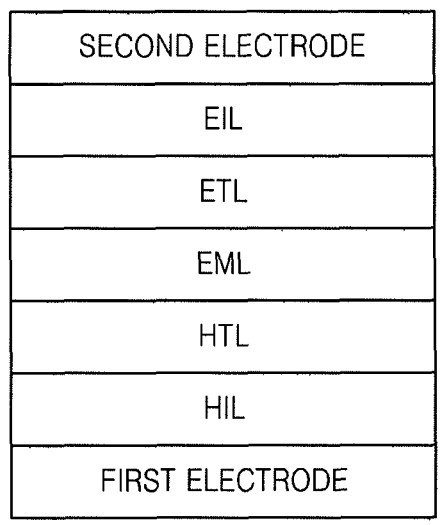
FIG. 1 illustrates a schematic view of a structure of an organic light-emitting device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

According to an embodiment, an organic light-emitting device may include a first electrode, a second electrode, and an organic layer between the first electrode and the second electrode. The organic layer may include an emission layer, and the emission layer may include at least one N-doping layer, e.g., one or two N-doping layers.

Some types of organic light-emitting devices may use a host-dopant system in an emission layer.

Emission in the emission layer may be dependent on, e.g., characteristics of a material forming the emission layer, an amount of electrons migrated from an electron transport layer, and/or an amount of holes migrated from a hole transport layer. The emission in the emission layer may influence efficiency and lifetime of the organic light-emitting device.

Controlling the amount of electrons in the emission layer by increasing the mobility of electrons may be difficult. The lifetime or efficiency of the emission layer (red, green, and blue emission layers) may rely on the electron injection from the electron transport layer as a common layer, and it may be difficult to achieve a balance between electrons and holes in each of the red, green, and blue emission layers.

The mobility of holes in the emission layer may be so high that holes may migrate over the emission layer into the electron transport layer, thus damaging the organic light-emitting device. An active-matrix organic light-emitting device (AM OLED) structure may use a hole blocking layer. According to an embodiment, a surface region of the emission layer adjacent to the electron transport layer may be partially doped with N-dopants to enable the emission layer to serve both as an emission layer and a hole blocking layer. For example, the N-doping layer may serve as a hole blocking layer.

The organic light-emitting device according to an embodiment may help prevent damage caused migration of holes from an anode to the electron transport layer, due to the emission layer (red, green, blue emission layers) including a portion doped with N-dopants. The N-doping layer may be a layer obtained by directly doping portions of an emission layer (EML, host-dopant) with N-dopants, and consequently may be a mixed layer of an EML-Host, an EML-Dopant, and N-dopants. For example, the EML may be deposited, and then a material for forming the EML may be co-deposited with the N-dopants to form the N-doping layer on the EML to contact the ETL.

In an implementation, the organic layer of the organic light-emitting device may include an electron transport layer, and one N-doping layer may contact the electron transport layer.

In an implementation, the organic layer of the organic light-emitting device may include an electron transport layer and a hole transport layer, one N-doping layer may contact the electron transport layer, and another N-doping layer may be in, e.g., contained within, the emission layer. For example, the EML may be deposited, a material for forming the EML may be co-deposited with the N-dopants, and more of the EML may be deposited to form the N-doping layer within the EML, and then a material for forming the EML may be co-deposited with the N-dopants to form the N-doping layer on the EML to contact the ETL.

In an implementation, the emission layer of the organic light-emitting device may include a host and a dopant, and the dopant of the emission layer may be the same as or different from a dopant of the N-doping layer.

In an implementation, a dopant in the N-doping layer of the organic light-emitting device may be a suitable boron-based compound.

In an implementation, a dopant of the N-doping layer of the organic light-emitting device may be or may include lithium quinolate (LiQ).

In an implementation, the N-doping layer of the organic light-emitting device may have a thickness of about 20 Å to about 100 Å. When the thickness of the N-doping layer is within this range, the organic light-emitting device may exhibit improved efficiency and improved lifetime.

For example, the N-doping layer of the organic light-emitting device may include a host and a dopant of the emission layer and a dopant of the N-doping layer, and may be in contact with the electron transport layer or within the emission layer.

The organic layer may further include at least one layer selected from among a hole injection layer, a hole transport layer, a functional layer having both hole injection and hole transport capabilities (hereinafter, "H-functional layer"), a buffer layer, an electron blocking layer, an emission layer, a hole blocking layer, an electron transport layer, an electron injection layer, and a functional layer having both electron injection and electron transport capabilities (hereinafter, "E-functional layer").

In an implementation, the organic light-emitting device may include an electron injection layer, an electron transport layer, an emission layer, a hole injection layer, a hole transport layer, and/or a functional layer having both hole injection and transport capabilities. The emission layer may include, e.g., an anthracene-based compound, an arylamine-based compound or a styryl-based compound.

In an implementation, the organic light-emitting device may include an electron injection layer, an electron transport layer, an emission layer, a hole injection layer, a hole transport layer, and/or a functional layer having both hole injection and transport capabilities. At least one of a red emission layer, a green emission layer, a blue emission layer, and a white emission layer of the emission layer may include a phosphorescent compound. At least one of the hole injection layer, the hole transport layer, or the functional layer having both hole injection and hole transport capabilities may include a charge-generating material. In an implementation, the charge-generating material may be a p-type dopant. The p-type dopant may be or may include a quinine derivative, a metal oxide, or a cyano group-containing compound.

In an implementation, the organic film may include an electron transport layer. The electron transport layer may include an electron-transporting organic compound and a metal complex. The metal complex may be or may include a lithium (Li) complex.

The term "organic layer" as used herein may refer to a single layer and/or a plurality of layers between the first and second electrodes of the organic light-emitting device.

The organic film may include an emission layer. The emission layer may include a suitable emission material. The organic film may include at least one of a hole injection layer, a hole transport layer, or a functional layer having both hole injection and hole transport capabilities (hereinafter, "H-functional layer"). At least one of the hole injection layer, the hole transport layer, or the functional layer having both hole injection and hole transport capabilities may include a suitable material.

FIG. 1 illustrates a schematic cross-sectional view of one type of organic light-emitting device. Hereinafter, a structure of an organic light-emitting device and a method of manufacturing the same will now be described with reference to FIG. 1.

A substrate (not shown) may include a suitable substrate for organic light emitting devices. In an implementation, the substrate may be a glass substrate or a transparent plastic substrate having strong mechanical strength, thermal stability, transparency, surface smoothness, ease of handling, and water resistance.

The first electrode may be formed by depositing or sputtering a first electrode-forming material on the substrate. When the first electrode is an anode, a material having a high work function may be used as the first electrode-forming material to facilitate hole injection. The first electrode may be a reflective electrode or a transmission electrode. Transparent and conductive materials such as ITO, IZO, $SnO_2$, and ZnO may be used to form the first electrode. The first electrode may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode may have a single-layer structure or a multi-layer structure including at least two layers. For example, the first electrode may have a three-layered structure of ITO/Ag/ITO, but is not limited thereto.

An organic layer or layers may be disposed on the first electrode.

The organic layer may include a hole injection layer (HIL), a hole transport layer (HTL), a buffer layer (not shown), an emission layer (EML), an electron transport layer (ETL), and/or an electron injection layer (EIL).

The HIL may be formed on the first electrode by any of a variety of methods, e.g., vacuum deposition, spin coating, casting, Langmuir-Blodgett (LB) deposition, or the like.

When the HIL is formed using vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec.

When the HIL is formed using spin coating, the coating conditions may vary according to the compound that is used to form the HIL, and the desired structure and thermal properties of the HIL to be formed. For example, the coating rate may be in the range of about 2,000 rpm to about 5,000 rpm, and a temperature at which heat treatment is performed to remove a solvent after coating may be in the range of about 80° C. to about 200° C.

The HIL may be formed of a suitable material for forming a HIL. Non-limiting examples of the material that may be used to form the HIL may include N,N'-diphenyl-N,N'-bis-[4-(phenyl-m-tolyl-amino)-phenyl]-biphenyl-4,4'-diamine, (DNTPD), a phthalocyanine compound such as copperphthalocyanine, 4,4',4"-tris(3-methylphenylphenylamino)triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline)/poly(4-styrenesulfonate (PANI/PSS).

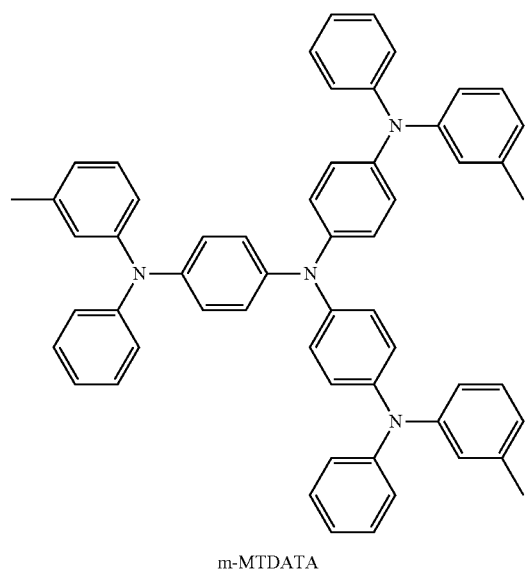

m-MTDATA

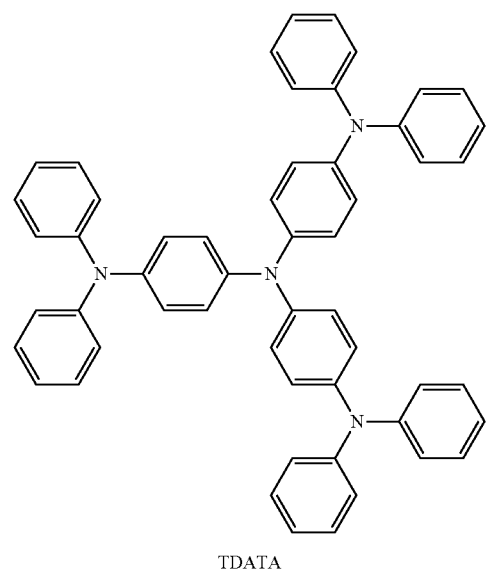

TDATA

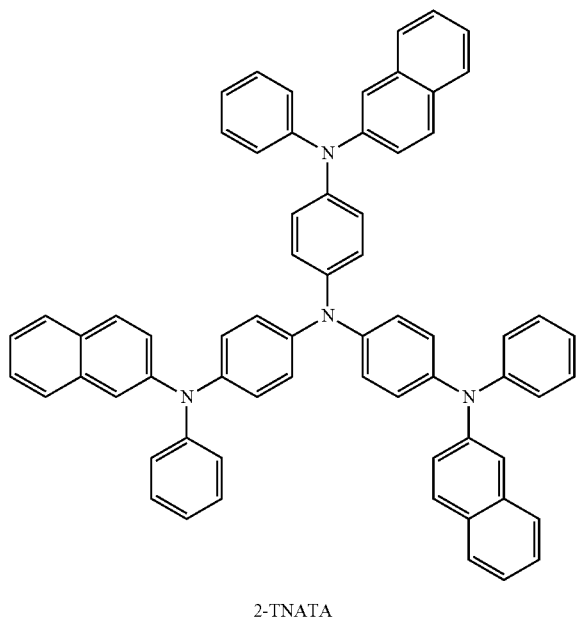 [SMILES: c1ccc(N(c2ccc(N(c3ccc(N(c4ccccc4)c4ccc5ccccc5c4)cc3)c3ccc(N(c4ccccc4)c4ccc5ccccc5c4)cc3)cc2)c2ccc3ccccc3c2)cc1]

2-TNATA

The thickness of the HIL may be about 100 Å to about 10,000 Å, e.g., about 100 Å to about 1,000 Å. When the thickness of the HIL is within these ranges, the HIL may have good hole injecting ability without a substantial increase in driving voltage.

Next, the HTL may be formed on the HIL using any of a variety of methods, e.g., vacuum deposition, spin coating, casting, LB deposition, or the like. When the HTL is formed using vacuum deposition or spin coating, the conditions for deposition and coating may be similar to those for the formation of the HIL, though the conditions for the deposition and coating may vary according to the material that is used to form the HTL.

The HTL may be formed of a suitable hole-transporting material. Non-limiting examples of suitable HTL forming materials may include carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4', 4"-tris(N-carbazolyl)triphenylamine (TCTA), and N,N'-di(1-naphthyl)-N,N'-diphenylbenzidine) (NPB).

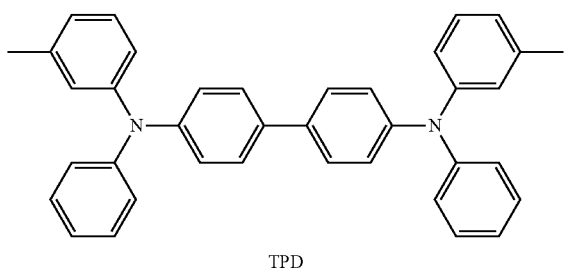

TPD

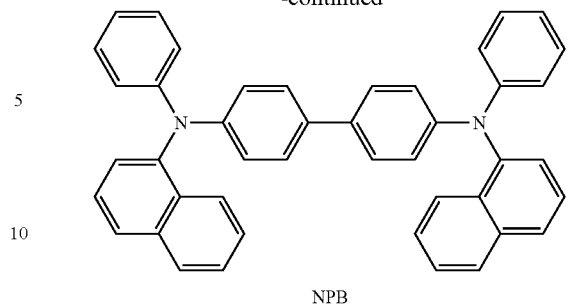

NPB

In an implementation, the thickness of the HTL may be from 50 Å to about 2,000 Å, e.g., about 100 Å to about 1,500 Å. When the thickness of the HTL is within these ranges, the HTL may have good hole transporting ability without a substantial increase in driving voltage.

The H-functional layer (e.g., having both hole injection and hole transport capabilities) may contain at least one material from each group of the hole injection layer materials and hole transport layer materials. In an implementation, the thickness of the H-functional layer may be about 500 Å to about 10,000 Å, e.g., about 100 Å to about 1,000 Å. When the thickness of the H-functional layer is within these ranges, the H-functional layer may have good hole injection and transport capabilities without a substantial increase in driving voltage.

In an implementation, at least one of the HIL, HTL, and H-functional layer may include at least one of a compound of Formula 300 or a compound of Formula 350, below.

<Formula 300>

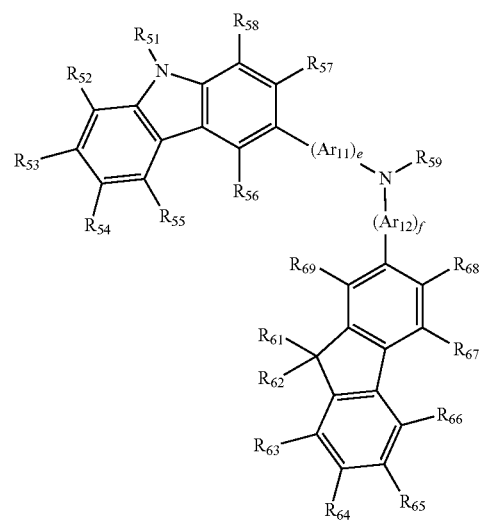

<Formula 350>

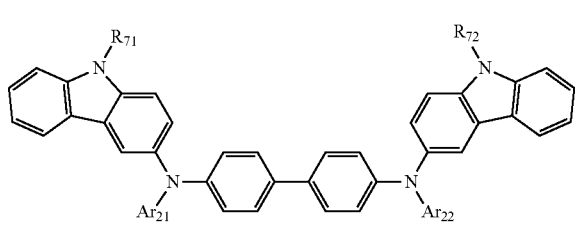

In Formulae 300 and 350, $Ar_{11}$, $Ar_{12}$, $Ar_2$, and $Ar_{22}$ may each independently be a substituted or unsubstituted $C_5$-$C_{60}$ arylene group.

In Formula 300, e and f may each independently be an integer from 0 to 5, e.g., may be 0, 1, or 2. In an implementation, e may be 1, and f may be 0.

In Formulae 300 and 350 above, $R_{51}$ to $R_{58}$, $R_{61}$ to $R_{69}$, and $R_{71}$ and $R_{72}$ may each independently be a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group. In an implementation, $R_{51}$ to $R_{58}$, $R_{61}$ to $R_{69}$, $R_{71}$, and $R_{72}$ may each independently be one of a hydrogen atom; a deuterium atom; a halogen atom; a hydroxyl group; a cyano group; a nitro group; an amino group; an amidino group; a hydrazine group; a hydrazone group; a carboxyl group or a salt thereof; a sulfonic acid group or a salt thereof; a phosphoric acid group or a salt thereof; a $C_1$-$C_{10}$ alkyl group (for example, a methyl group, an ethyl group, a propyl group, a butyl group, a pentyl group, a hexyl group, or the like); a $C_1$-$C_{10}$ alkoxy group (for example, a methoxy group, an ethoxy group, a propoxy group, a butoxy group, a pentoxy group, or the like); a $C_1$-$C_{10}$ alkyl group and a $C_1$-$C_{10}$ alkoxy group that are substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof; a phenyl group; a naphthyl group; an anthryl group; a fluorenyl group; a pyrenyl group; or a phenyl group, a naphthyl group, an anthryl group, a fluorenyl group, and a pyrenyl group that are substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{10}$ alkyl group, or a $C_1$-$C_{10}$ alkoxy group.

In Formula 300, $R_{59}$ may be one of a phenyl group, a naphthyl group, an anthryl group, a biphenyl group, a pyridyl group; and a phenyl group, a naphthyl group, an anthryl group, a biphenyl group, and a pyridyl group that are substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{20}$ alkyl group, or a substituted or unsubstituted $C_1$-$C_{20}$ alkoxy group.

In an implementation, the compound represented by Formula 300 may be a compound represented by Formula 300A, below.

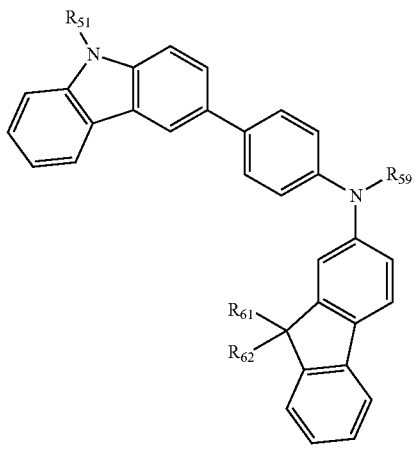

<Formula 300A>

In Formula 300A, $R_{51}$, $R_{61}$, $R_{62}$, and $R_{59}$ may be as defined above.

In an implementation, at least one of the HIL, HTL, and H-functional layer may include a compound represented by one of Formulae 301 to 320, below.

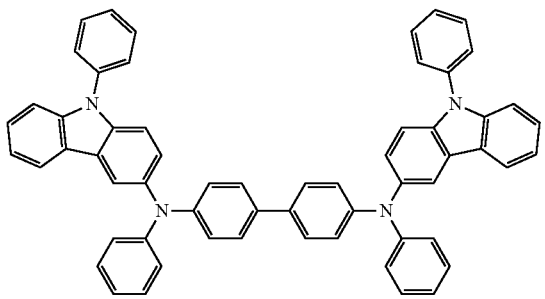

301

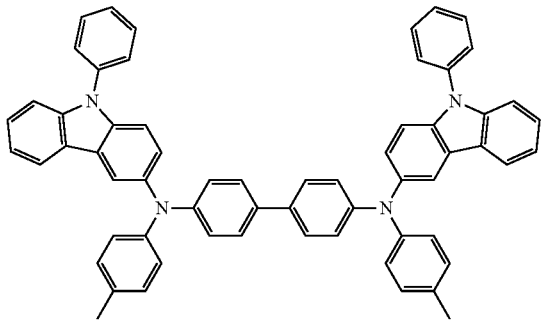

302

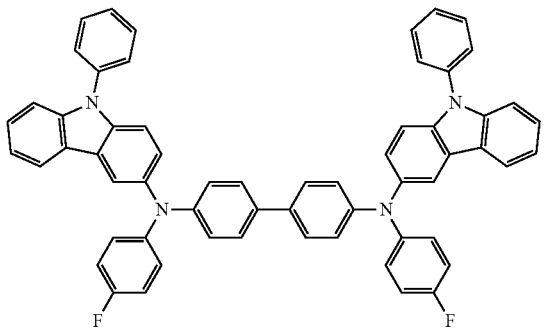

303

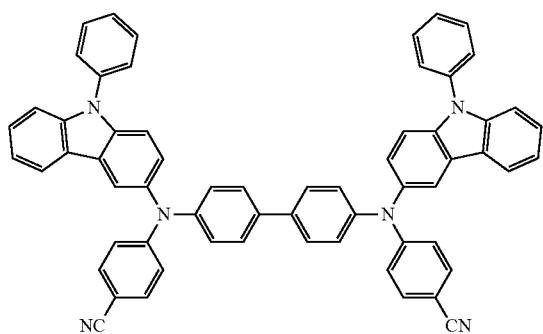
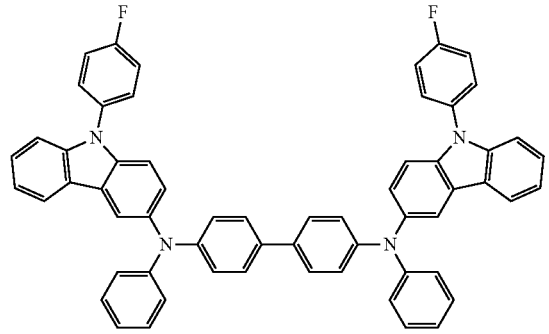

311
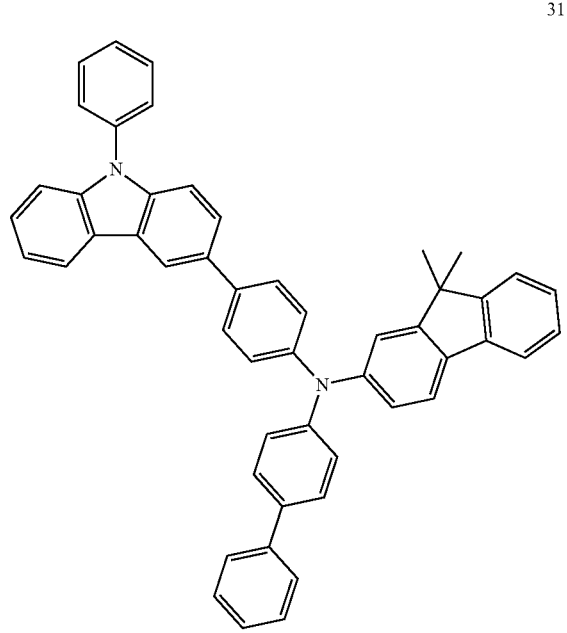
313
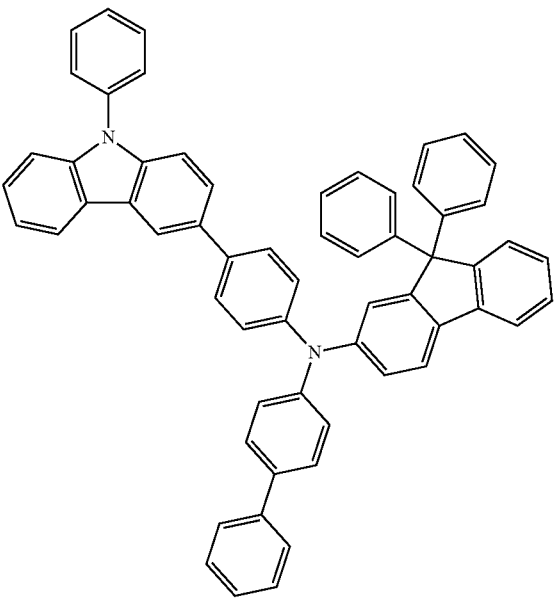
312
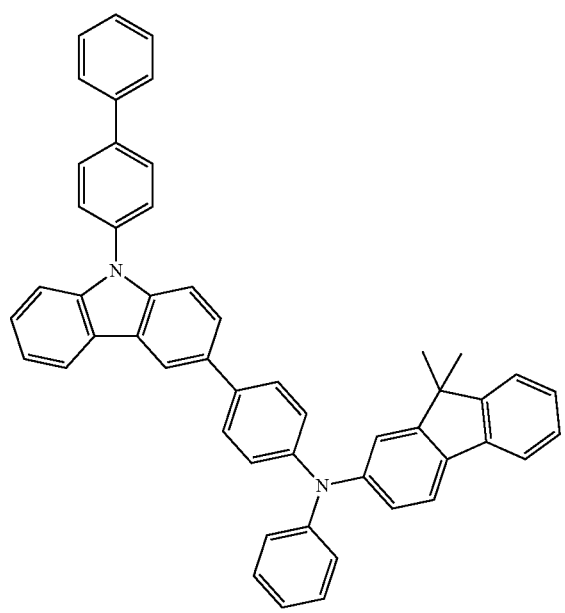
314
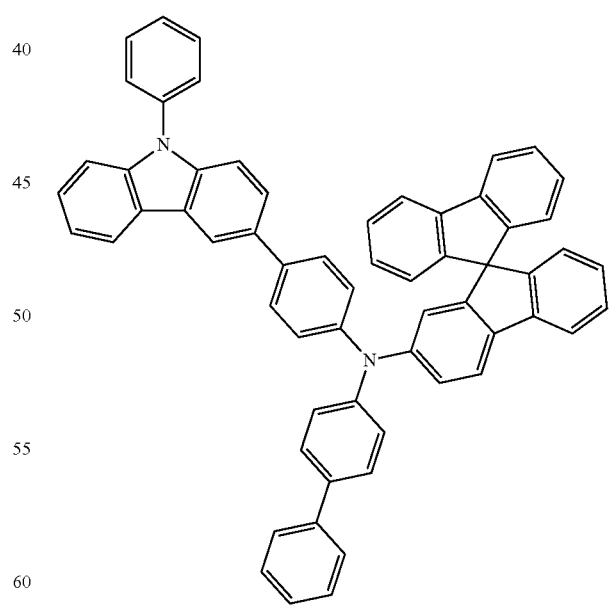

315
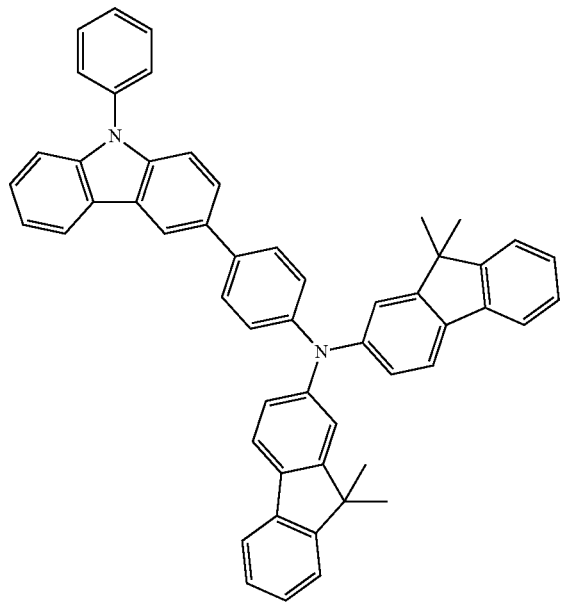
316
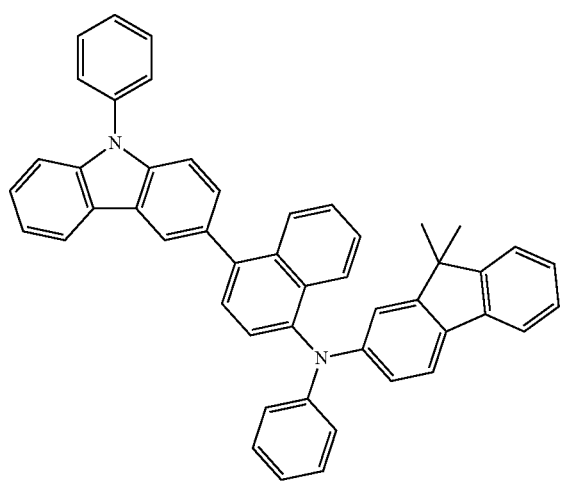
317
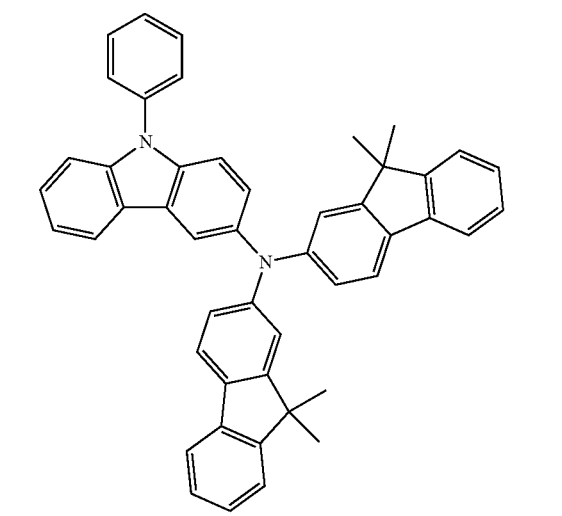
318
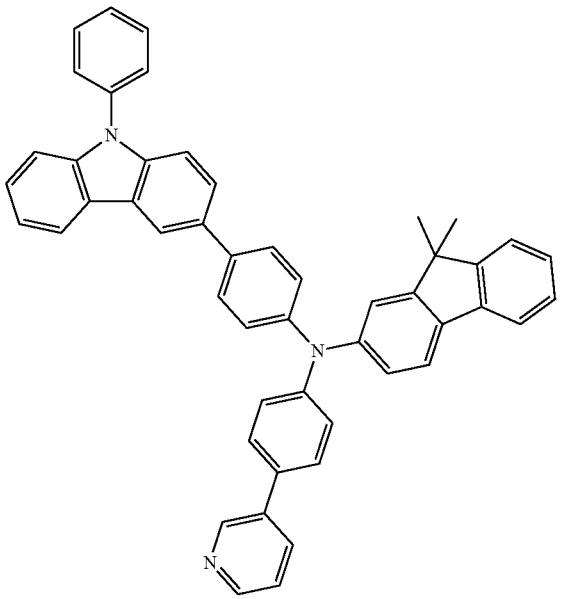
319
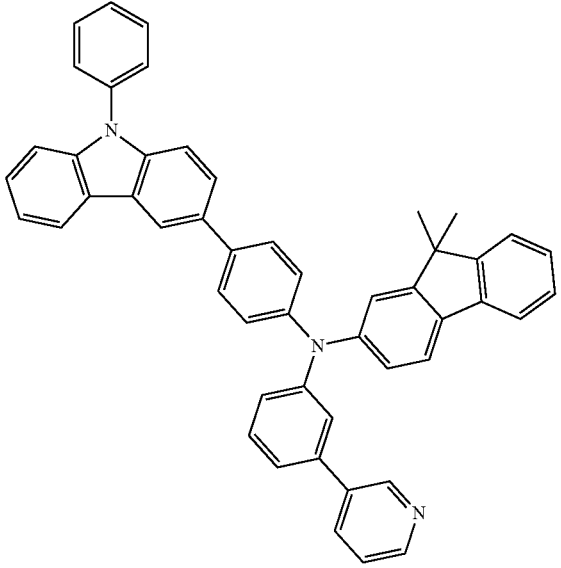

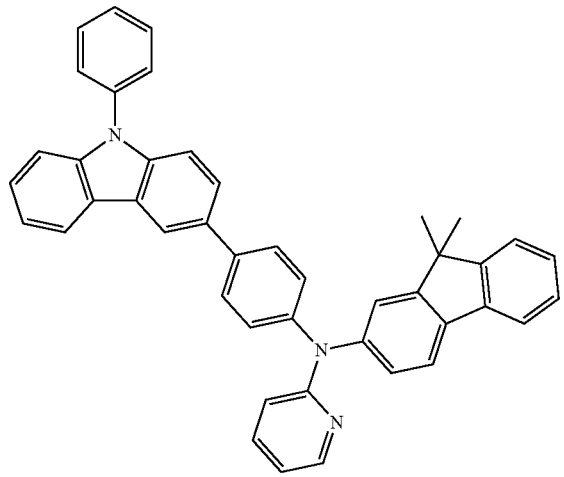

At least one of the HIL, HTL, and H-functional layer may further include a charge-generating material for improved layer conductivity, in addition to a suitable hole injecting material, hole transport material, and/or material having both hole injection and hole transport capabilities as described above.

The charge-generating material may include, e.g., a p-dopant. The p-dopant may be or may include one of quinine derivatives, metal oxides, or compounds with a cyano group. Examples of the p-dopant may include quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200 below.

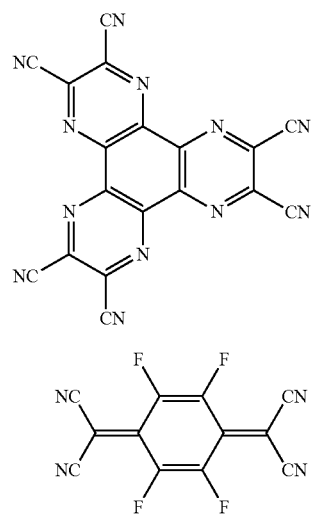

When the HIL, HTL, or H-functional layer further includes the charge-generating material, the charge-generating material may be homogeneously dispersed or heterogeneously distributed in the layer.

A buffer layer may be between at least one of the HIL, HTL, and H-functional layer, and the EML. The buffer layer may help compensate for an optical resonance distance of light according to a wavelength of the light emitted from the EML, and thus may help increase efficiency. The butter layer may include a suitable hole injecting material or hole transporting material. In an implementation, the buffer layer may include the same material as one of the materials included in the HIL, HTL, and H-functional layer that underlie the buffer layer.

Then, an EML may be formed on the HTL, H-functional layer, or buffer layer by vacuum deposition, spin coating, casting, Langmuir-Blodgett (LB) deposition, or the like. When the EML is formed using vacuum deposition or spin coating, the deposition and coating conditions may be similar to those for the formation of the HIL, though the conditions for deposition and coating may vary according to the material that is used to form the EML.

The EML may be formed using a suitable light-emitting material, e.g., suitable hosts and/or dopants. Dopants that may be used to form the EML may include either a fluorescent dopant or a phosphorescent dopant.

Example of suitable hosts may include $Alq_3$, 4,4'-N,N'-dicarbazole-biphenyl (CBP), poly(n-vinylcarbazole) (PVK), 9,10-di(naphthalene-2-yl)anthracene (DNA), TCTA, 1,3,5-tris(N-phenylbenzimidazole-2-yl)benzene (TPBI), 3-tert-butyl-9,10-di-2-naphthylanthracene (TBADN), E3, distyrylarylene (DSA), dmCBP (see a formula below), and Compounds 501 to 509 below.

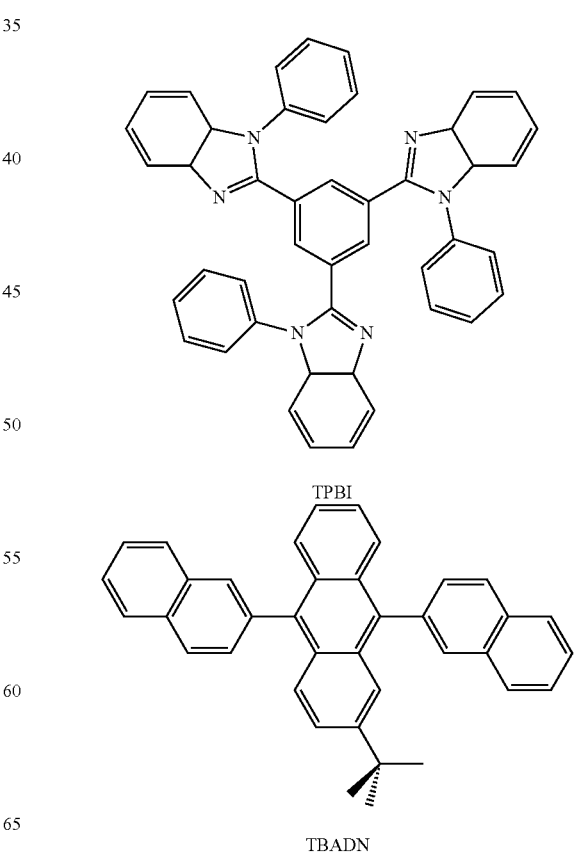

-continued
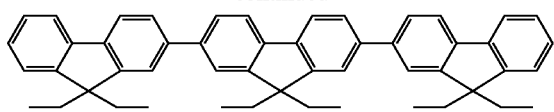
E3
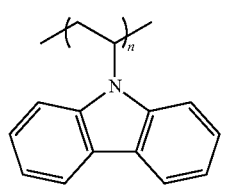
PVK
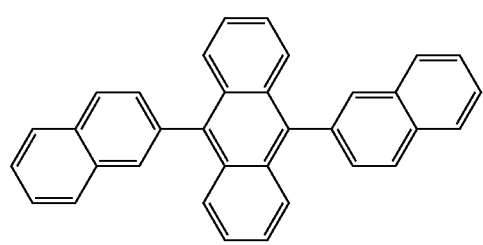
ADN
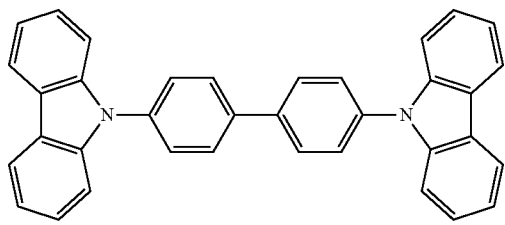
CBP
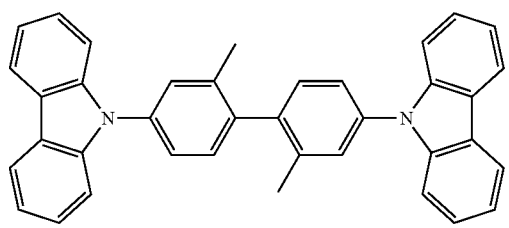
dmCBP
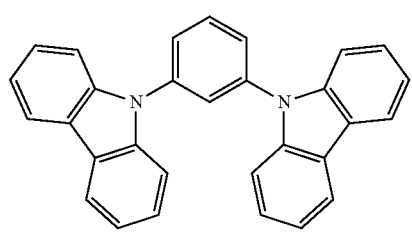
501
-continued
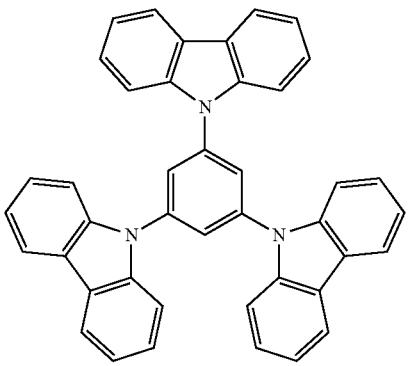
502
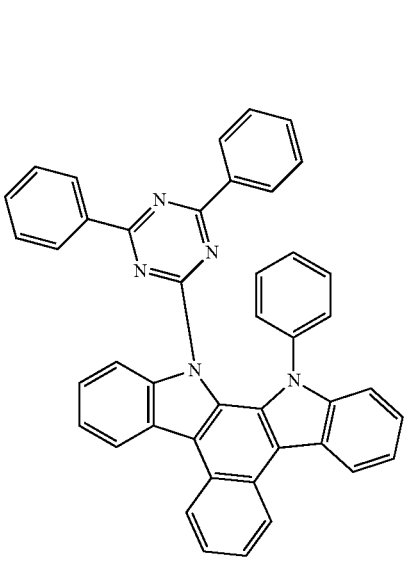
503
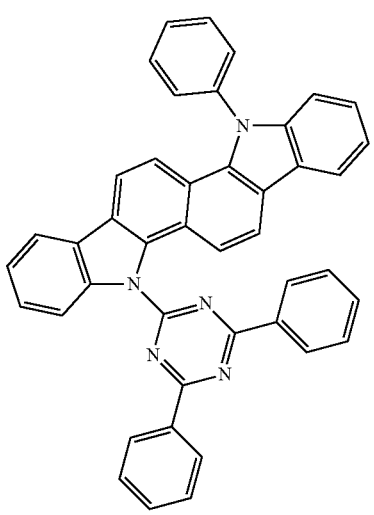
504

-continued

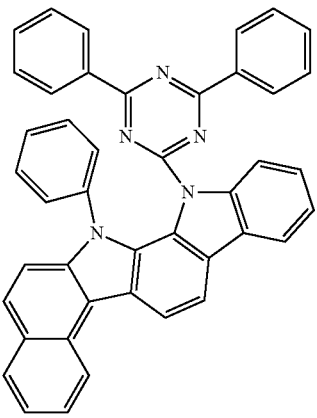
505

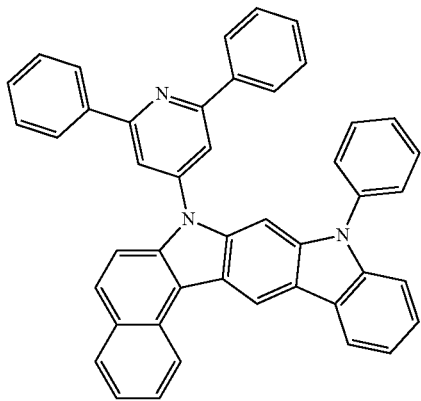
506

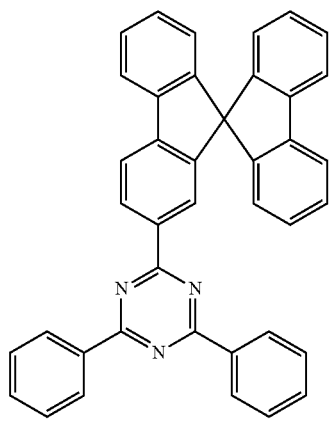
507

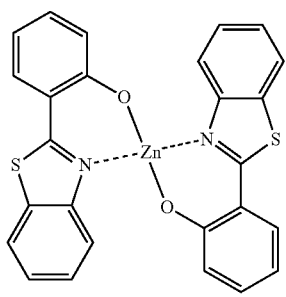
508

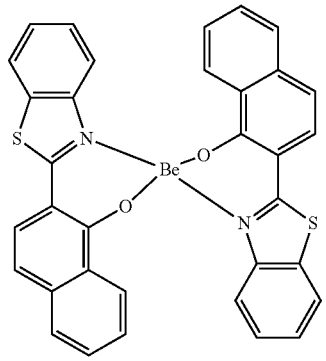
509

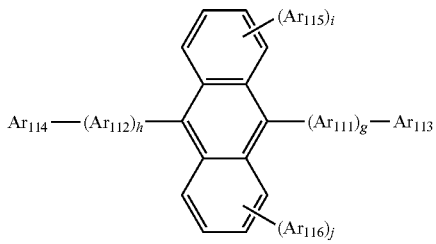

In an implementation, an anthracene-based compound represented by Formula 400 below may be used as the host.

<Formula 400>

In Formula 400, $Ar_{111}$ and $Ar_{112}$ may each independently be a substituted or unsubstituted $C_6$-$C_{60}$ arylene group; $Ar_{113}$ to $Ar_{116}$ may each independently be a substituted or unsubstituted $C_1$-$C_{10}$ alkyl group, or a substituted or unsubstituted $C_5$-$C_{60}$ aryl group; and g, h, i, and j may each independently be an integer of 0 to 4.

In an implementation, $Ar_m$ and $Ar_m$ in Formula 400 may each independently be a phenylene group, a naphthylene group, a phenanthrenylene group, or a pyrenylene group; or a phenylene group, a naphthylene group, a phenanthrenylene group, a fluorenyl group, or a pyrenylene group that are substituted with at least one of a phenyl group, a naphthyl group, or an anthryl group.

In Formula 400 above, g, h, i, and j may each independently be 0, 1, or 2.

In an implementation, $Ar_{113}$ to $Ar_{116}$ in Formula 400 may each independently be one of a $C_1$-$C_{10}$ alkyl group substituted with at least one of a phenyl group, a naphthyl group, and an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, and a fluorenyl group that are substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; or

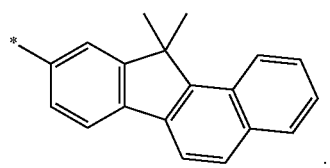 [SMILES: *c1ccc2c(c1)C(C)(C)c1c-2ccc2ccccc12]
For example, the anthracene-based compound of Formula 400 above may be one of the following compounds.
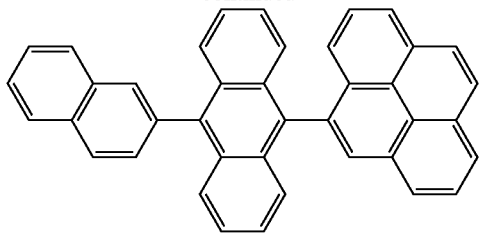
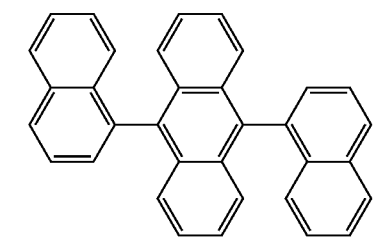
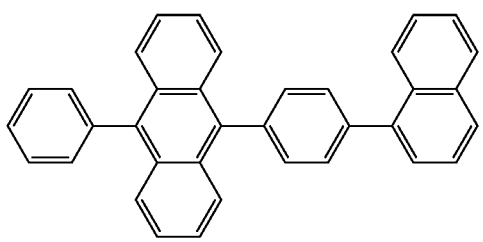
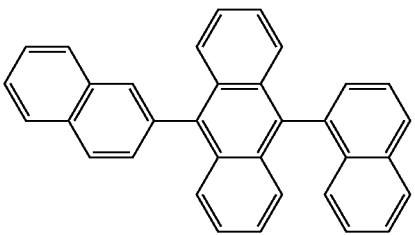
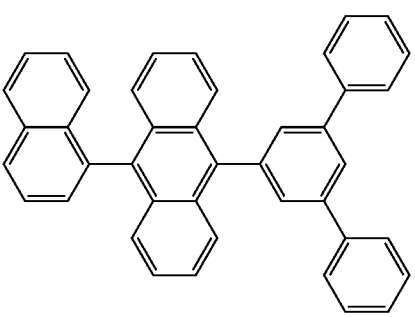
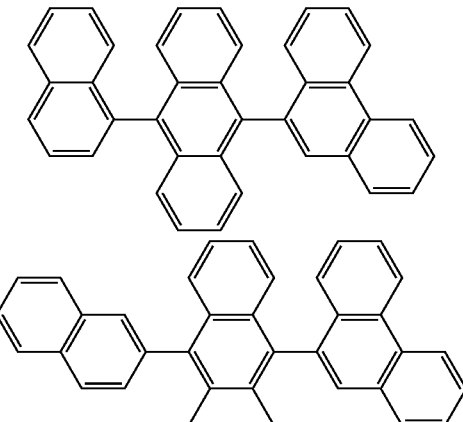
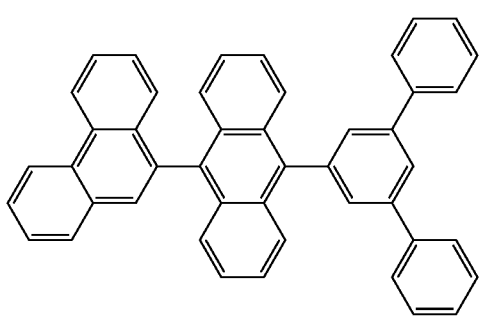
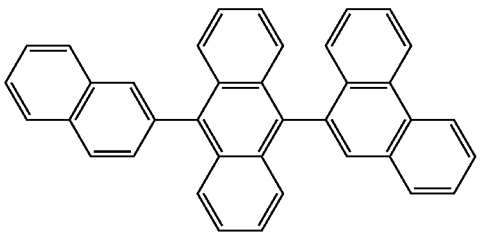
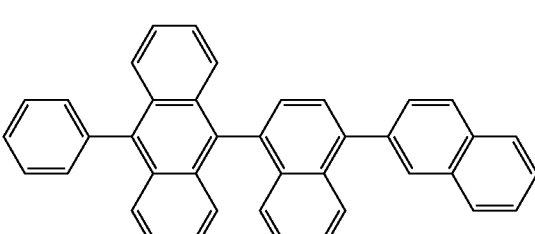
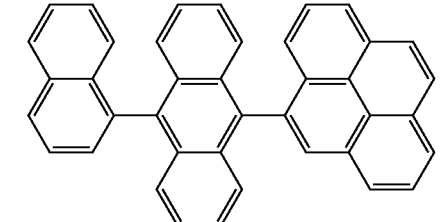
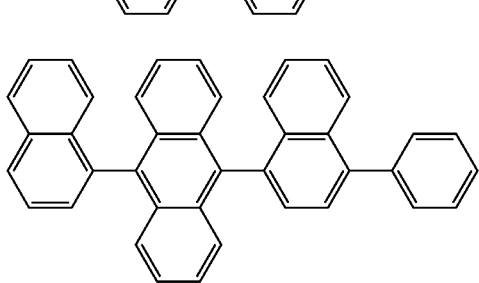
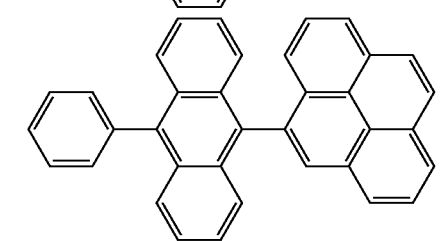

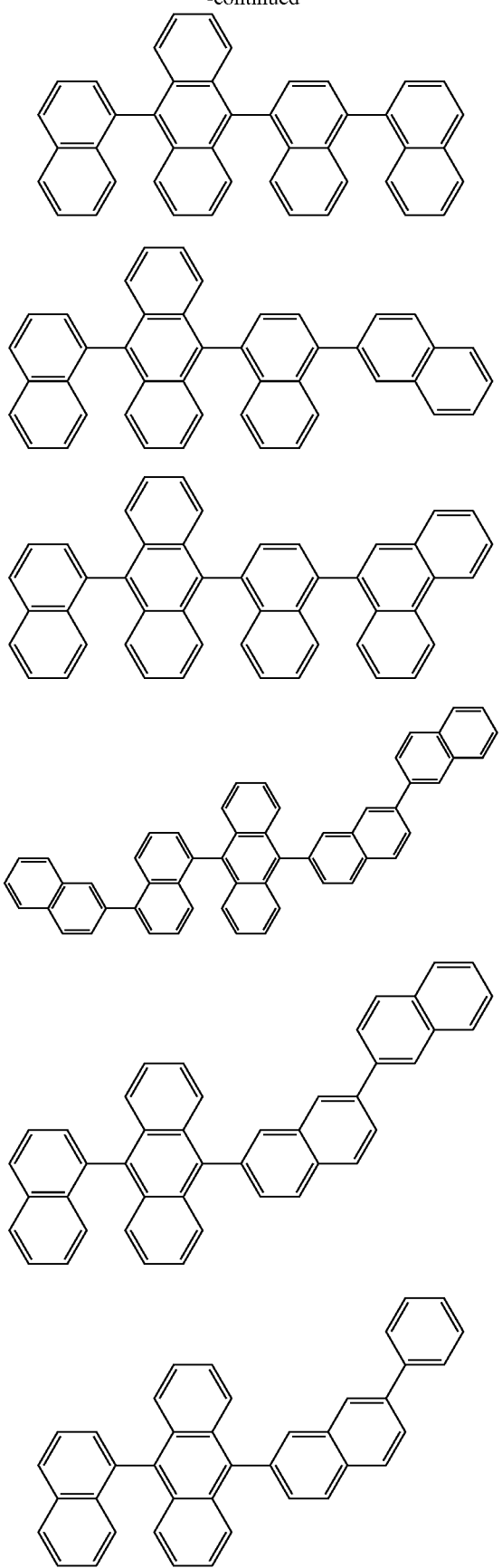
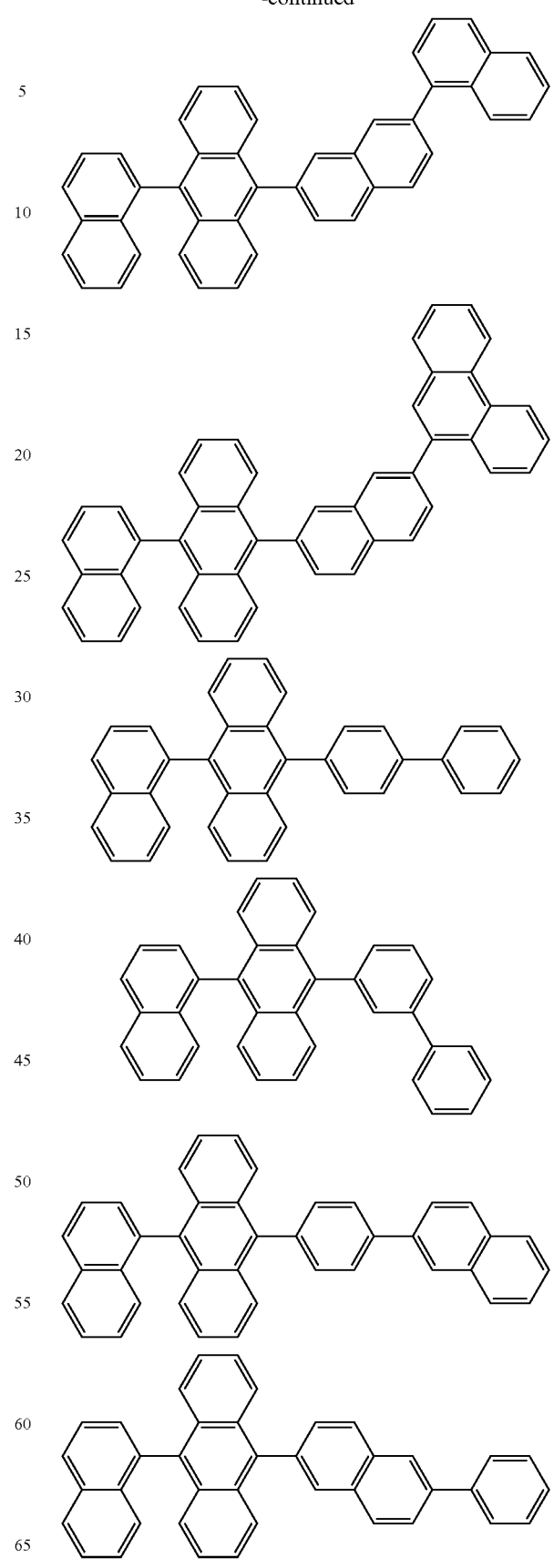

-continued
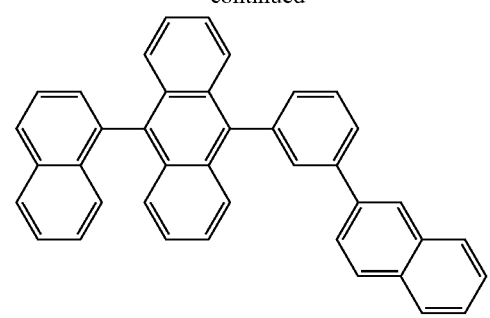
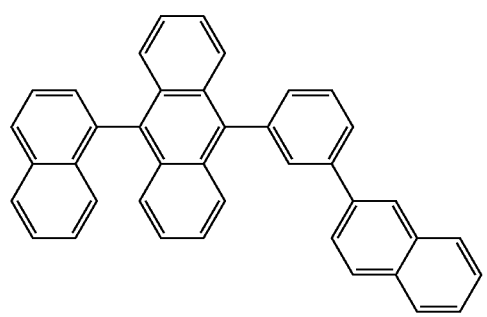
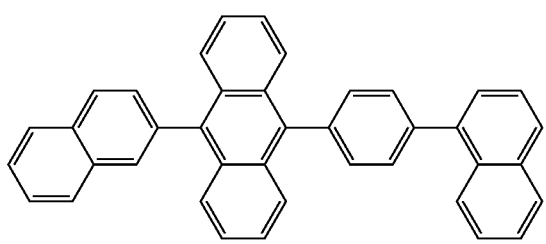
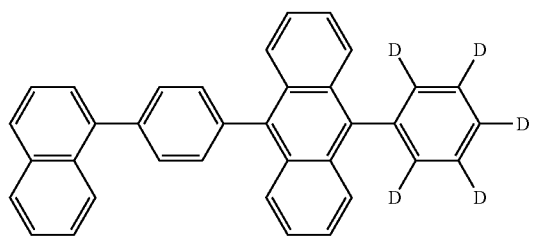
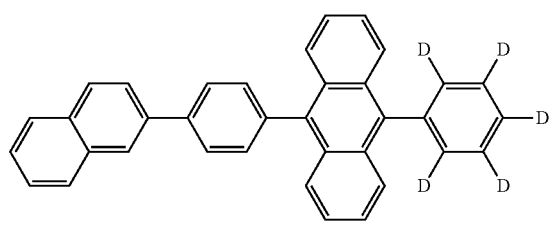
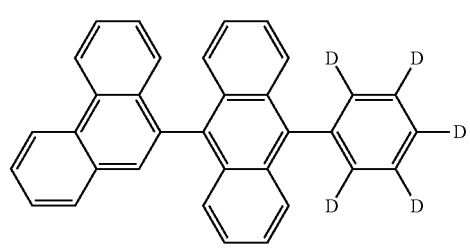
-continued
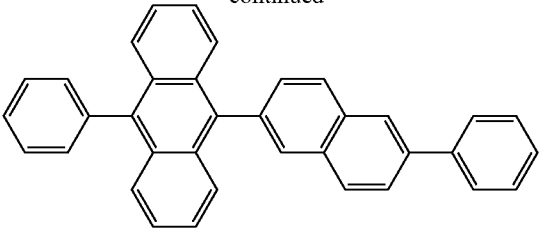
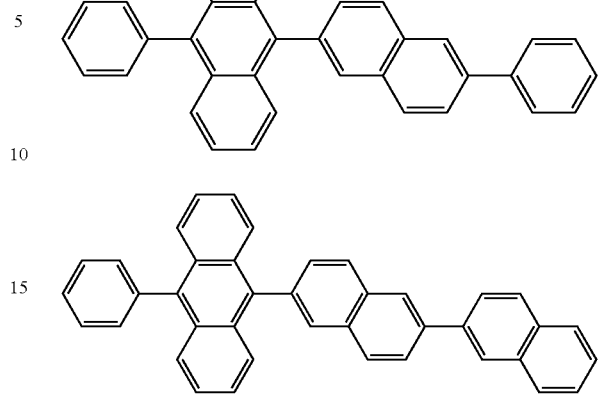
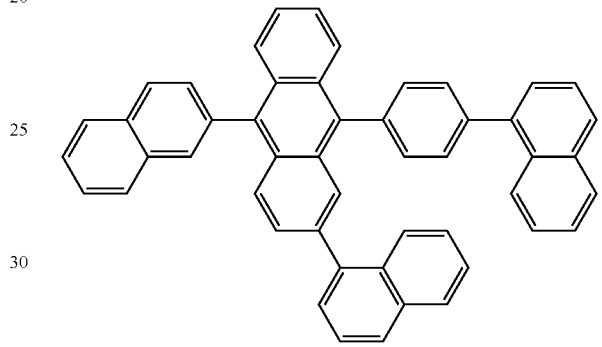
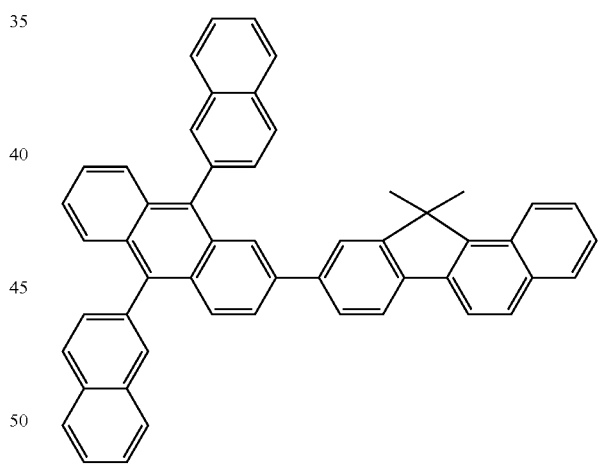
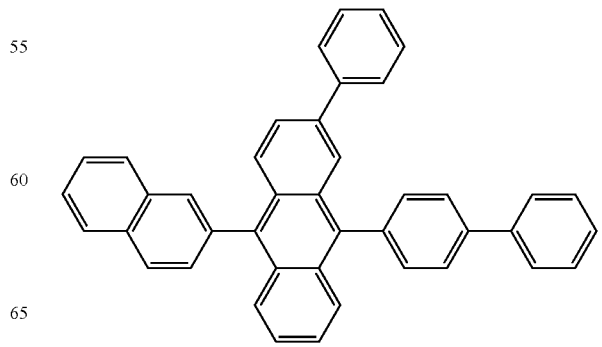

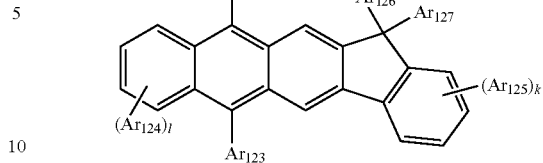

<Formula 401>

$Ar_{122}$ to $Ar_{125}$ in Formula 401 above may be defined as described above in conjunction with $Ar_{113}$ of Formula 400, and thus repeated detailed descriptions thereof will not be provided here.

$Ar_{126}$ and $Ar_{127}$ in Formula 401, above, may each independently be a $C_1$-$C_{10}$ alkyl group, e.g., a methyl group, an ethyl group, or a propyl group.

In Formula 401, k and l may each independently be an integer of 0 to 4, e.g., 0, 1, or 2.

For example, the anthracene compound of Formula 401 above may be one of the following compounds.

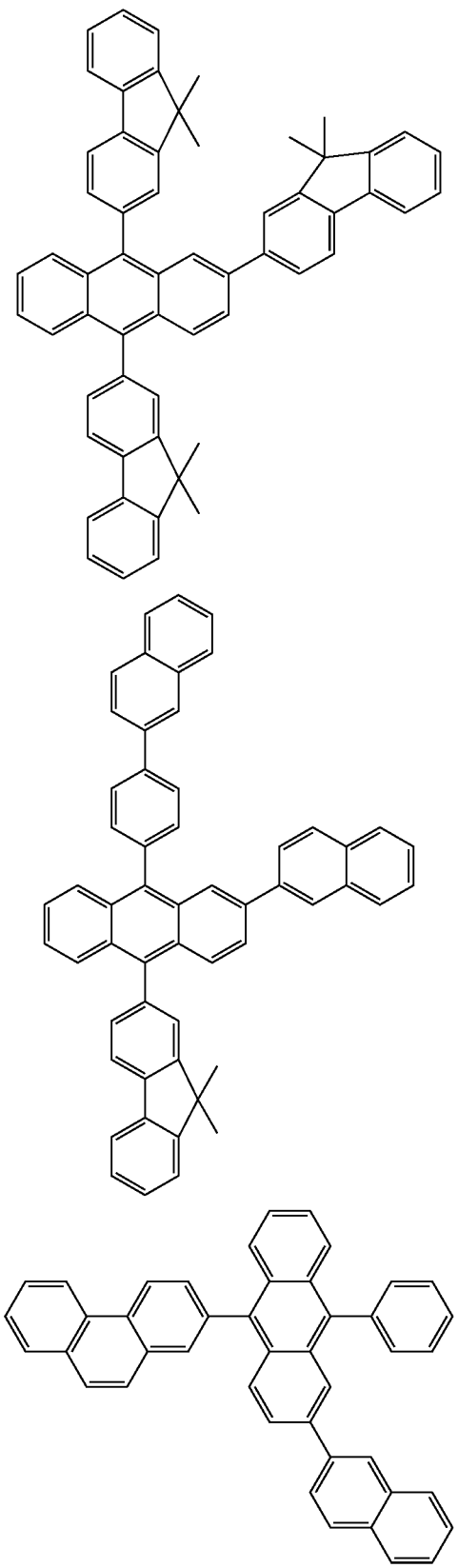

In an implementation, an anthracene-based compound represented by Formula 401, below, may be used as the host.

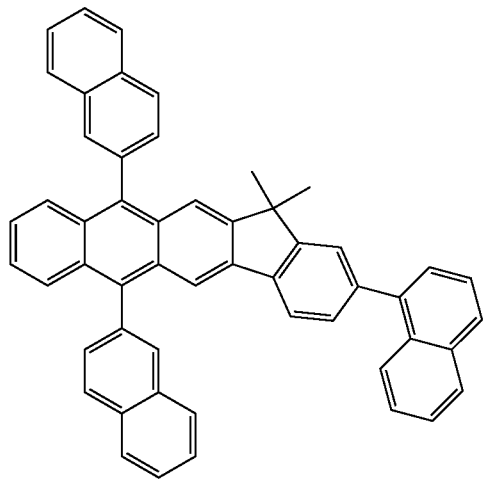

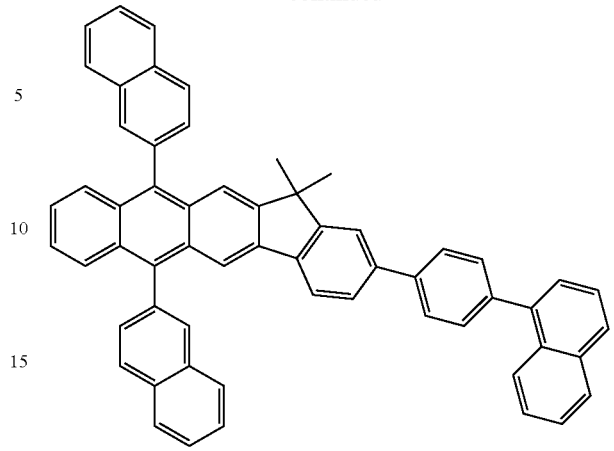

When the organic light-emitting device is a full color organic light-emitting device, the emission layer may be patterned into a red emission layer, a green emission layer, and a blue emission layer.

At least one of the red EML, the green EML, and the blue EML may include a dopant below (ppy=phenylpyridine).

Examples of the blue dopant may include compounds represented by the following formulae.

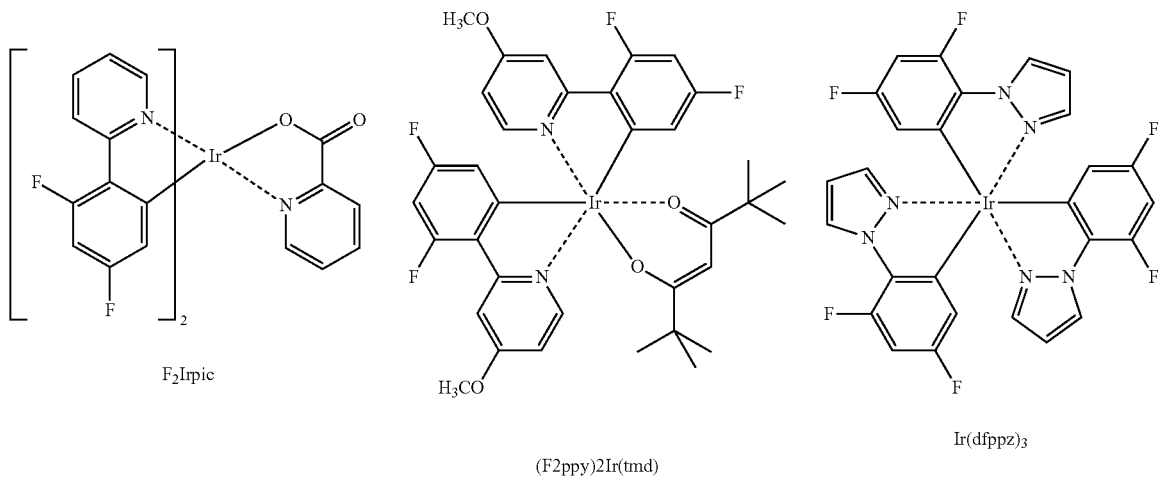

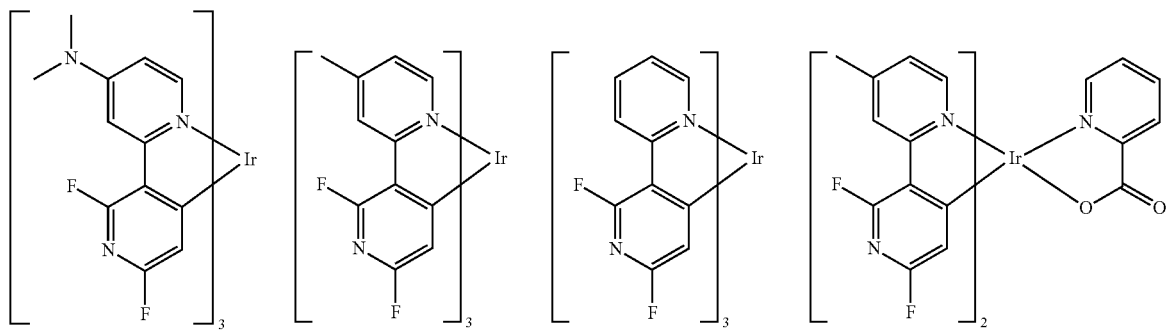

33
34
-continued
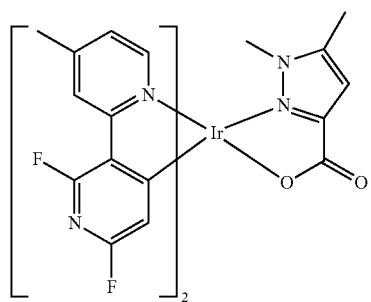
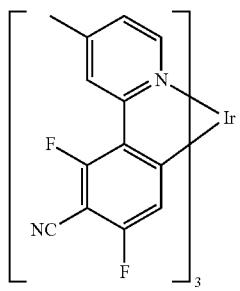
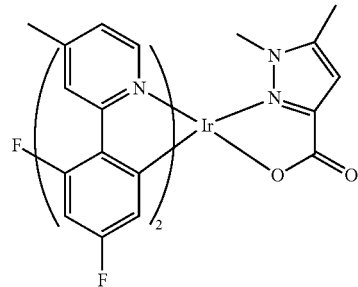
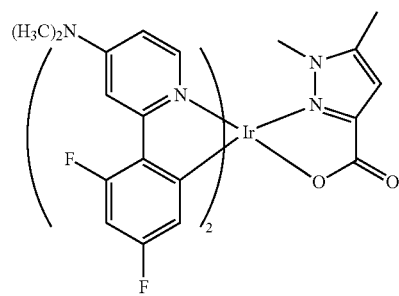
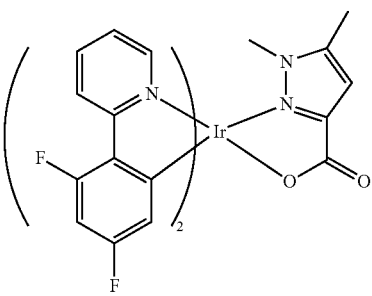
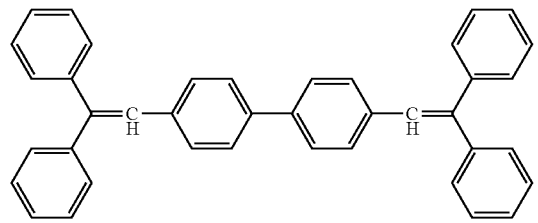
DPVBi
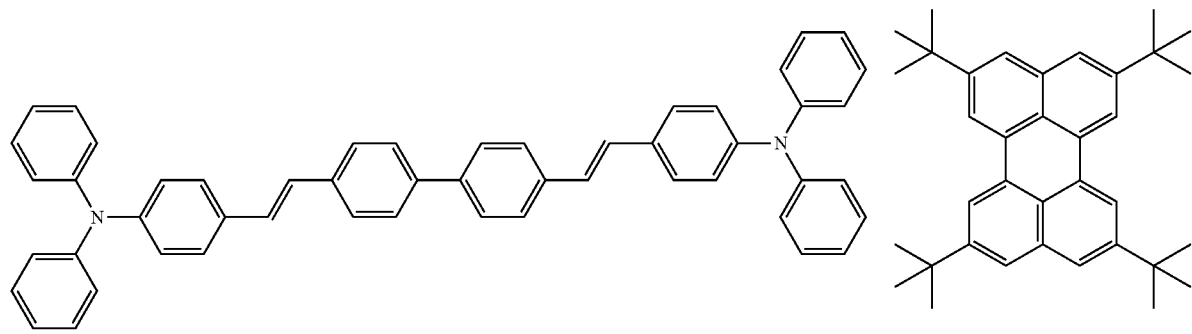
DPAVBi
TBPe Examples of the red dopant may include compounds represented by the following formulae.
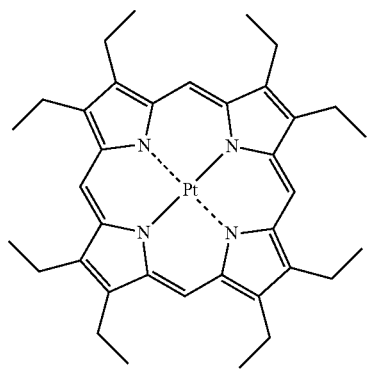
PtOEP
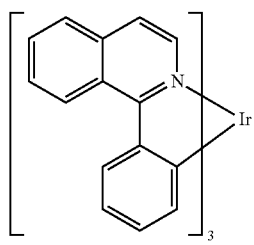
Ir(piq)₃
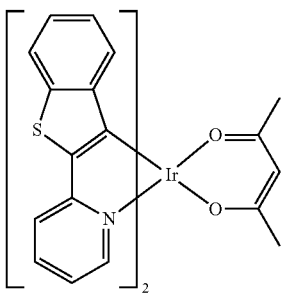
Btp₂Ir(acac)
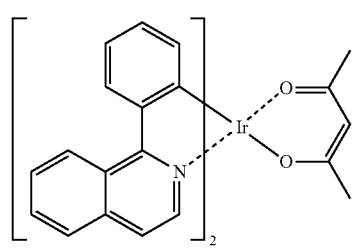
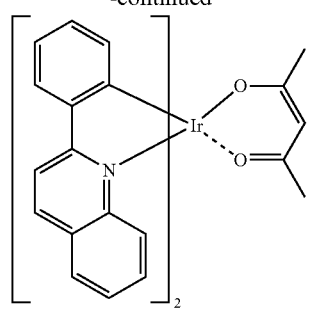
Ir(pq)₂(acac)
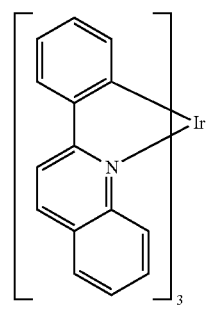
Ir(2-phq)₃
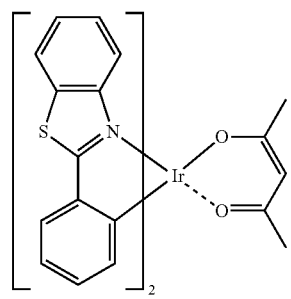
Ir(BT)₂(acac)
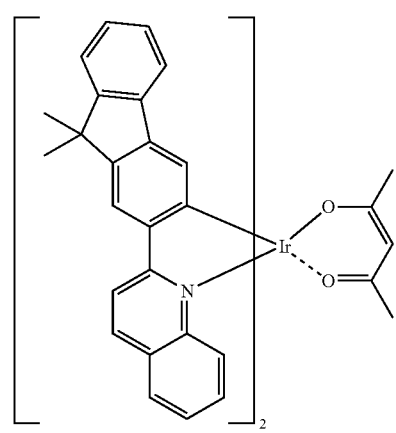
Ir(flq)₂(acac)

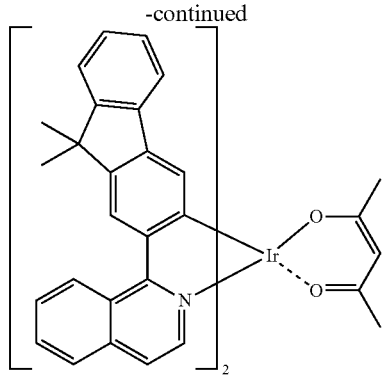
Ir(fliq)₂(acac)
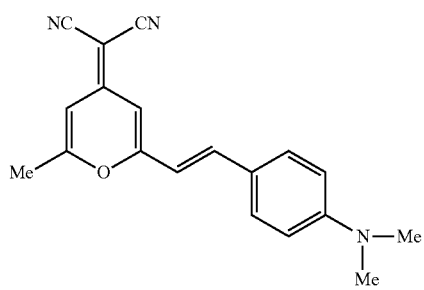
DCM
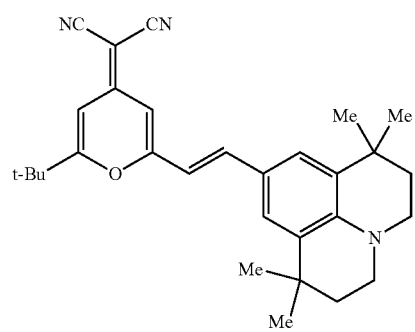
DCJTB
Examples of the green dopant may include compounds represented by the following formulae.
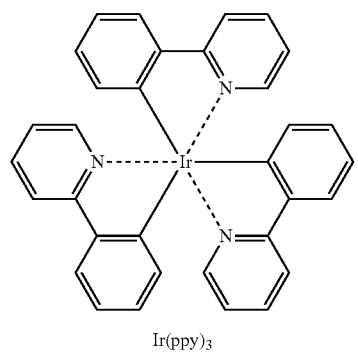
Ir(ppy)₃
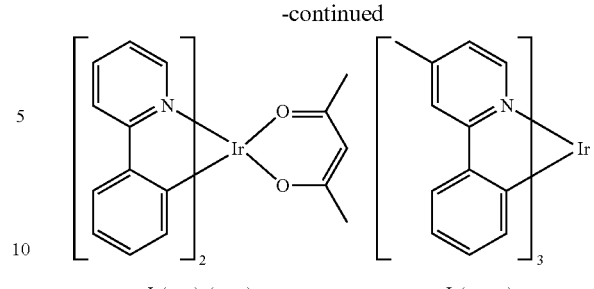
Ir(ppy)₂(acac)　　　　Ir(mpyp)₃
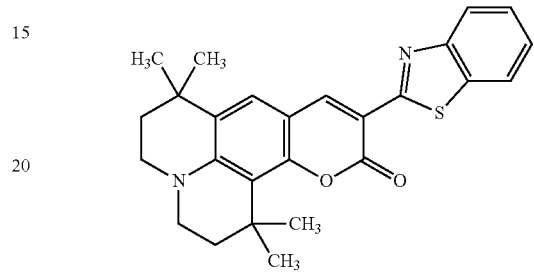
C545T
Examples of the dopant that may be used in the EML may include Pd complexes or Pt complexes represented by the following formulae.
D1
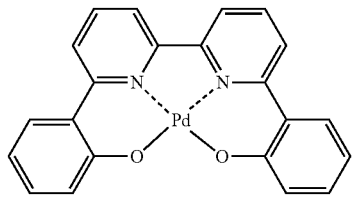
D2
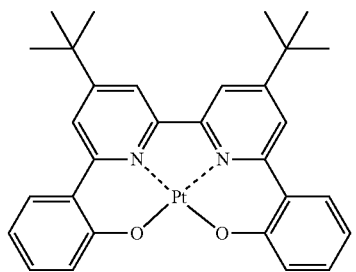
D3
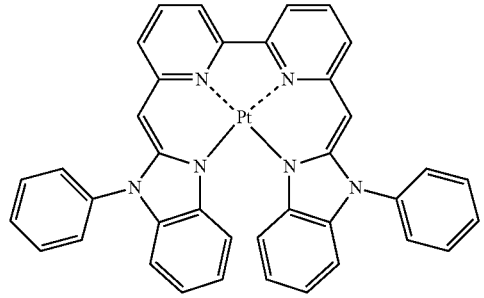

D4 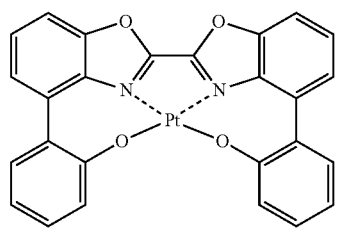
D5 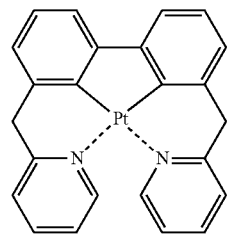
D6 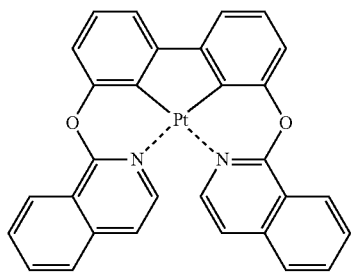
D7 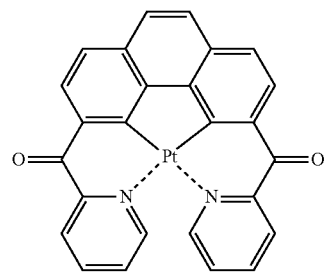
D8 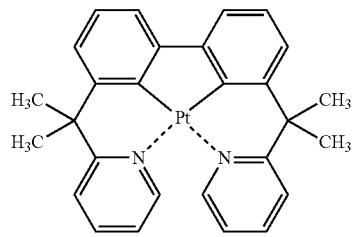
D9 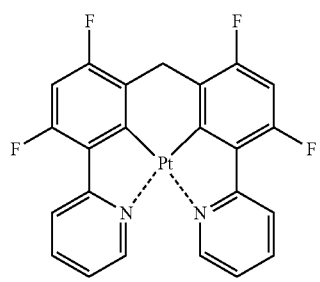
D10 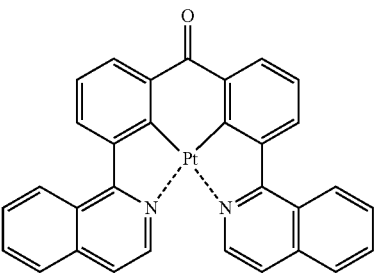
D11 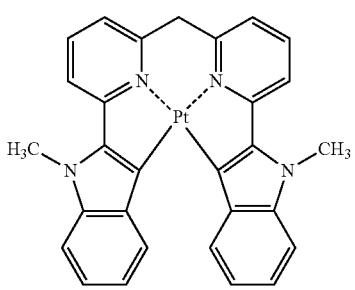
D12 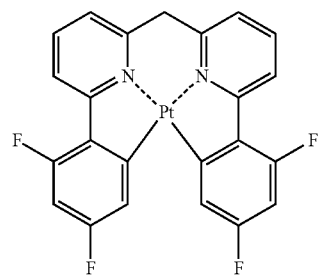
D13 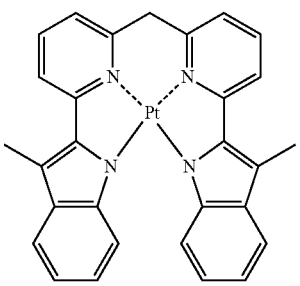
D14 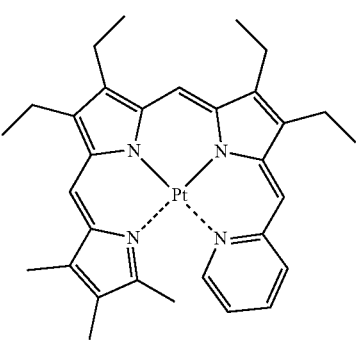

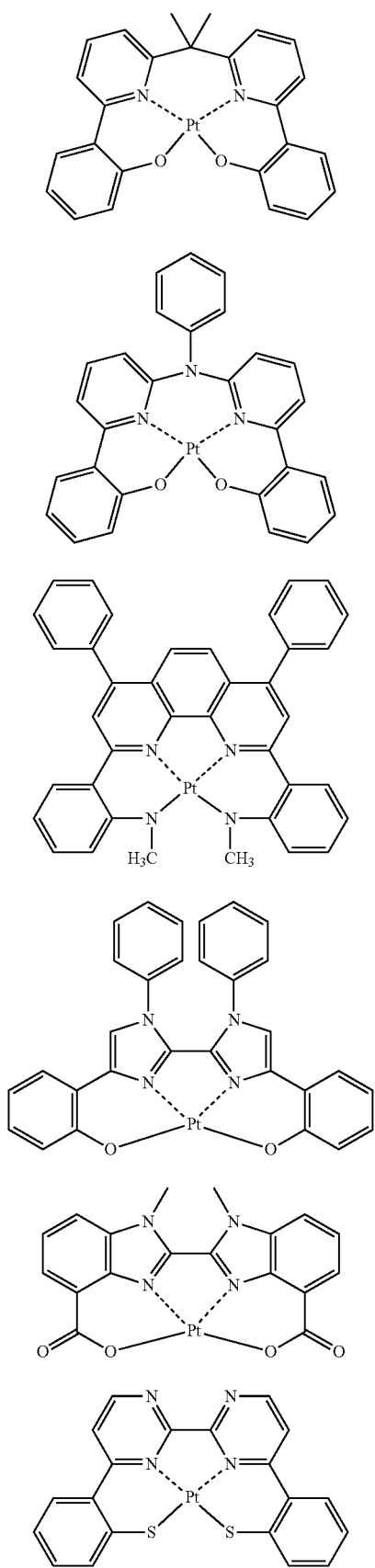
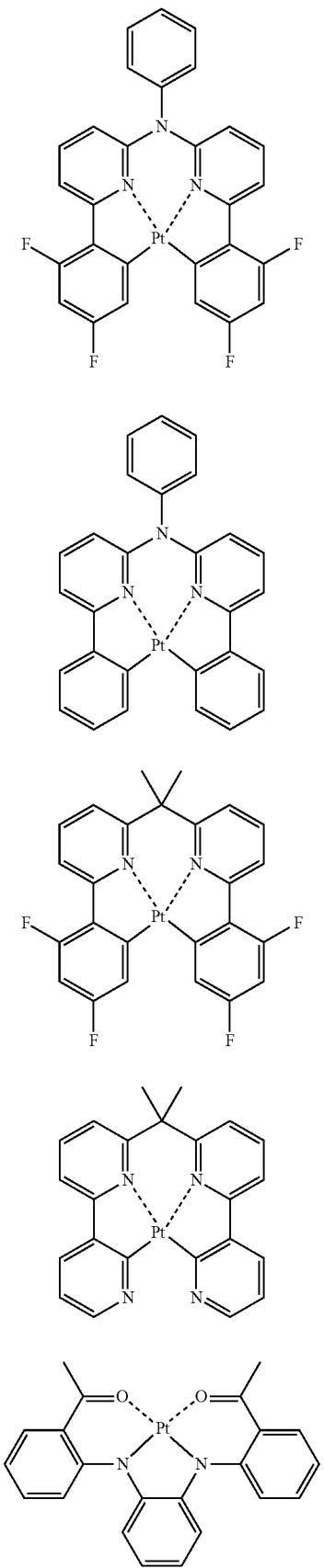

D26 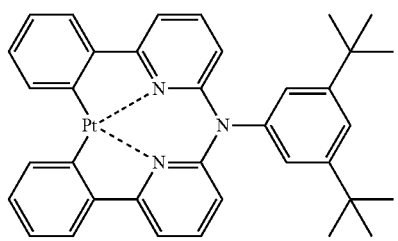
D27 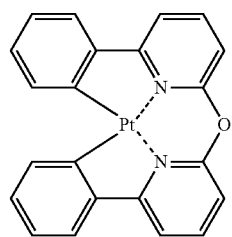
D28 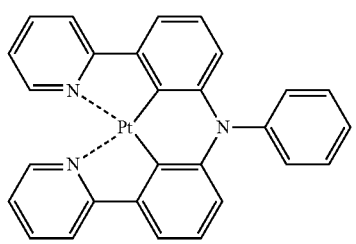
D29 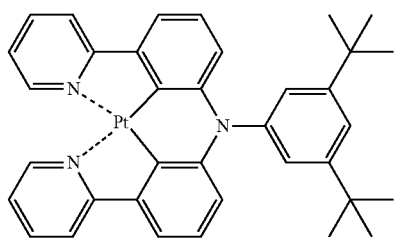
D30 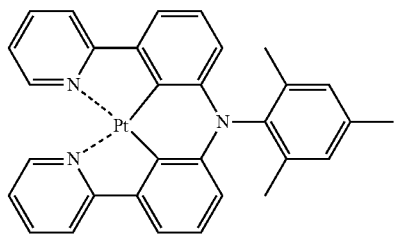
D31 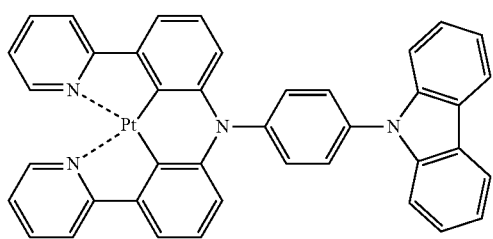
D32 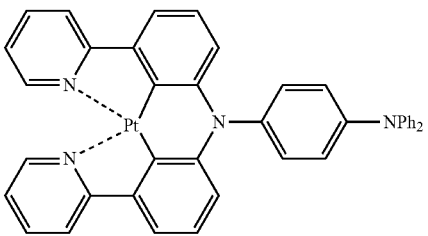
D33 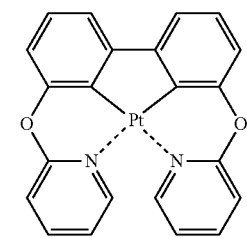
D34 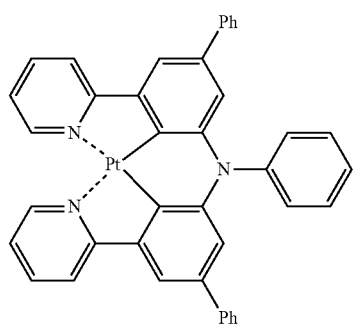
D35 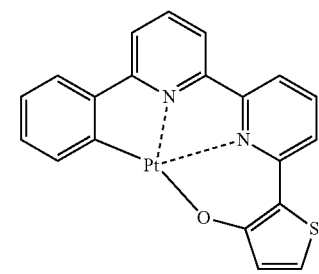
D36 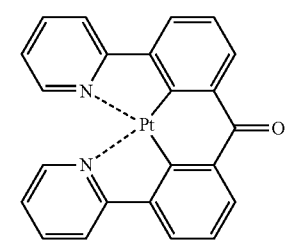

-continued
D37
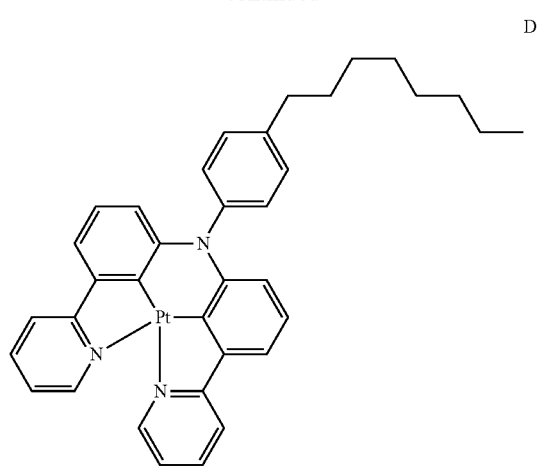
D38
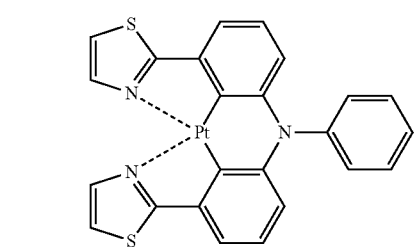
D39
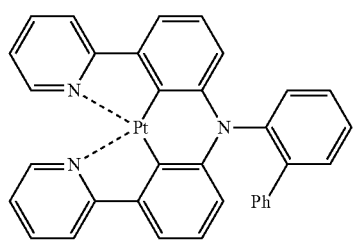
D40
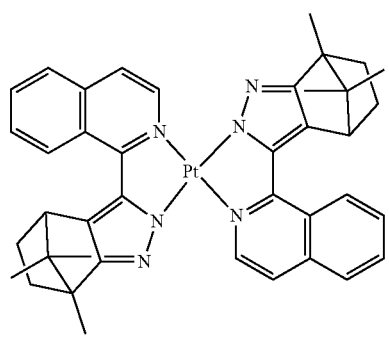
D41
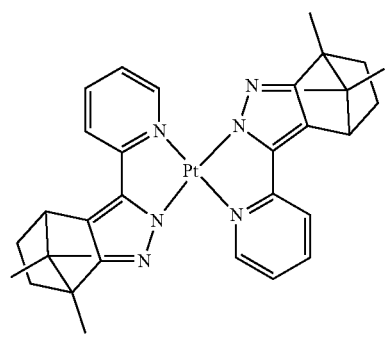
-continued
D42
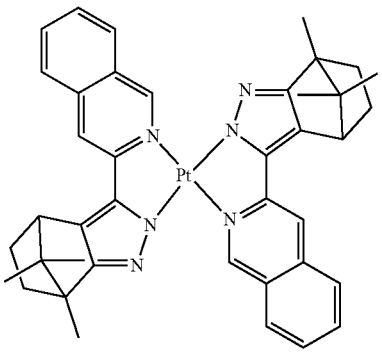
D43
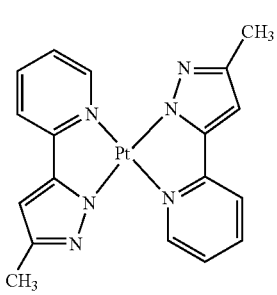
D44
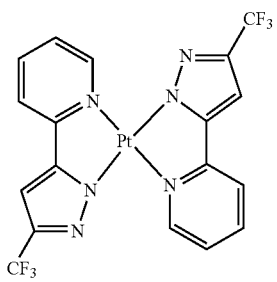
D45
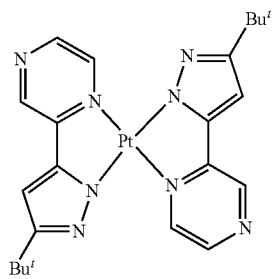
D46
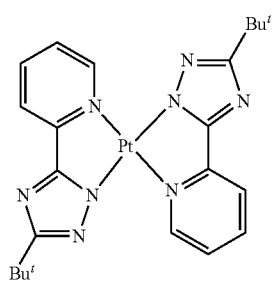

D47
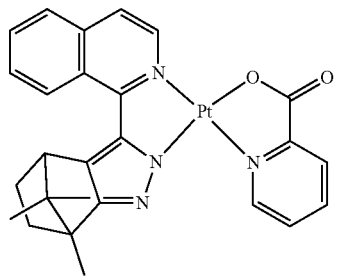

D48
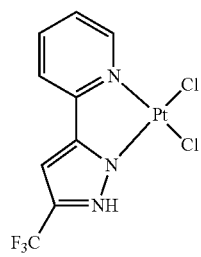

D49
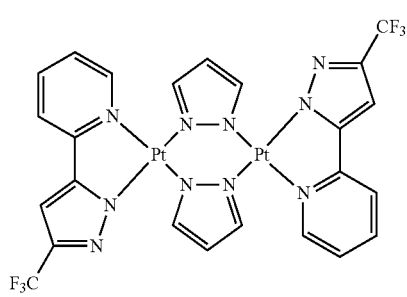

D50
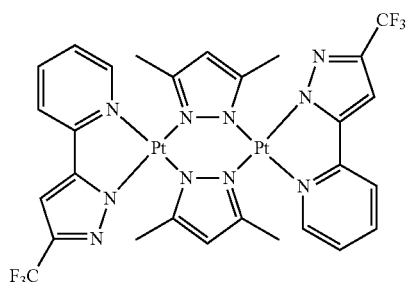

Examples of the dopant that may be used in the EML may include Os complexes represented by the following formulae.

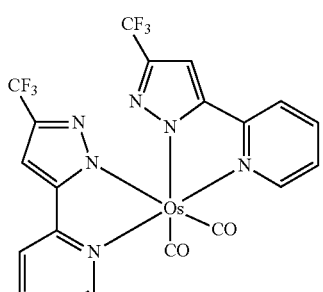

Os(fppz)$_2$(CO)$_2$

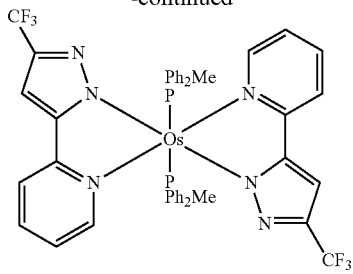

Os(fppz)$_2$(PPh$_2$Me)$_2$

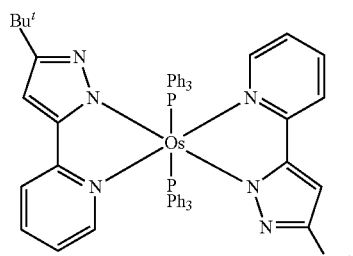

Os(bppz)$_2$(PPh$_3$)$_2$

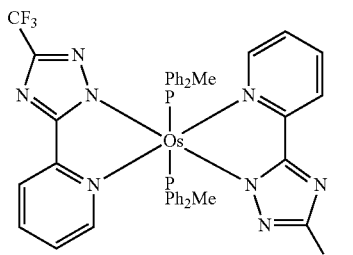

Os(fptz)$_2$(PPh$_2$Me)$_2$

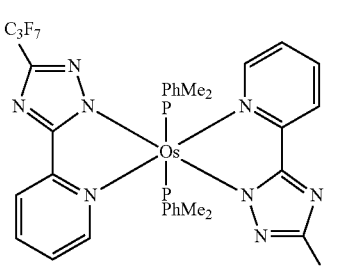

Os(hptz)$_2$(PPhMe$_2$)$_2$

When the EML includes both a host and a dopant, an amount of the dopant may be, e.g., about 0.01 to about 15 parts by weight, based on 100 parts by weight of the host.

The thickness of the EML may be about 100 Å to about 1,000 Å, e.g., about 200 Å to about 600 Å. When the thickness of the EML is within these ranges, the EML may exhibit good light emitting ability without a substantial increase in driving voltage.

Then, an ETL may be formed on the EML by, e.g., vacuum deposition, spin coating, casting, or the like. When the ETL is formed using vacuum deposition or spin coating, the deposition and coating conditions may be similar to those for the formation of the HIL, though the deposition and coating conditions may vary according to a compound that is used to form the ETL. A material for forming the ETL may include a suitable material that may stably transport electrons injected from an electron injecting electrode (cathode). Examples of materials for forming the ETL may include a quinoline derivative, such as tris(8-quinolinorate)aluminum (Alq$_3$), TAZ, BAlq, beryllium bis(benzoquinolin-10-olate (Bebq$_2$), 9,10-di(naphthalene-2-yl)anthracene (ADN), Compound 201, and Compound 202.

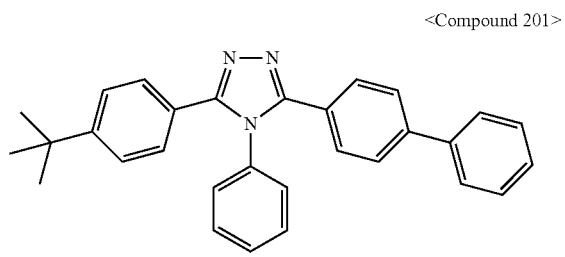

<Compound 201>

TAZ

<Compound 202>

BAlq

-continued

BCP

The thickness of the ETL may be about 100 Å to about 1,000 Å, e.g., about 150 Å to about 500 Å. When the thickness of the ETL is within these ranges, the ETL may have satisfactory electron transporting ability without a substantial increase in driving voltage.

In an implementation, the ETL may further include a metal-containing material, in addition to a suitable electron-transporting organic compound.

The metal-containing material may include a lithium (Li) complex. Examples of the Li complex may include lithium quinolate (LiQ) and Compound 203 below:

<Compound 203>

Then, an EIL, which may facilitate injection of electrons from the cathode, may be formed on the ETL. A suitable electron-injecting material may be used to form the EIL.

Examples of materials for forming the EIL may include LiF, NaCl, CsF, Li$_2$O, and BaO. The deposition and coating conditions for forming the EIL may be similar to those for the formation of the HIL, though the deposition and coating conditions may vary according to the material that is used to form the EIL.

The thickness of the EIL may be about 1 Å to about 100 Å, e.g., about 3 Å to about 90 Å. When the thickness of the EIL is within these ranges, the EIL may exhibit satisfactory electron injection ability without a substantial increase in driving voltage.

Finally, the second electrode may be disposed on the organic layer. The second electrode may be a cathode that is an electron injection electrode. A material for forming the second electrode may be or may include, e.g., a metal, an alloy, an electro-conductive compound, which have a low work function, or a mixture thereof. In this regard, the second electrode may be formed of or may include, e.g., lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In an implementation, to manufacture a top-emission light-emitting device, the transmission electrode may be formed of indium tin oxide (ITO) or indium zinc oxide (IZO).

Figure 2:
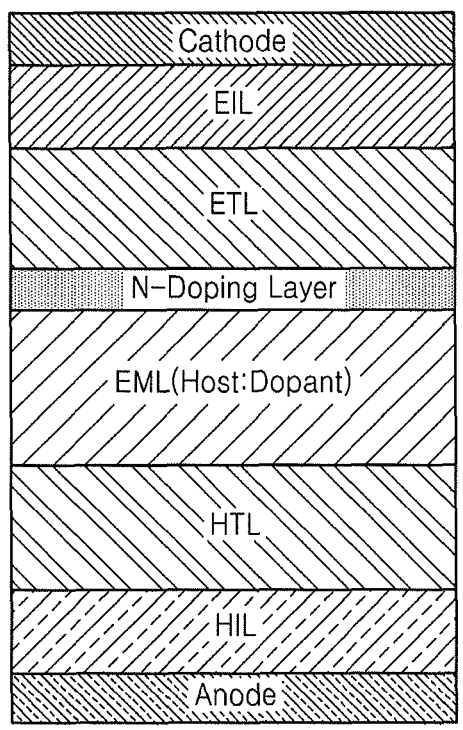
FIG. 2 illustrates a schematic view of a structure of an organic light-emitting device according to an embodiment.

FIG. 2 illustrates a schematic view of a structure of an organic light-emitting device according to an embodiment. In the embodiment of FIG. 2, an N-doping layer may contact an ETL.

Figure 3:
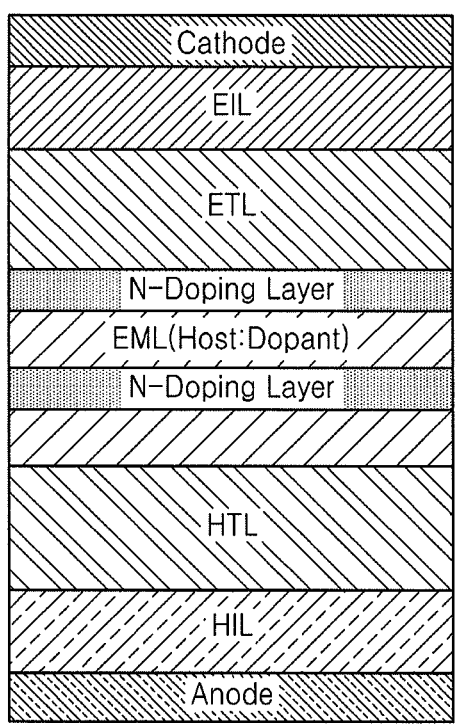
FIG. 3 illustrates a schematic view of a structure of an organic light-emitting device according to another embodiment.

FIG. 3 illustrates a schematic view of a structure of an organic light-emitting device according to another embodiment. In the embodiment of FIG. 3, one N-doping layer may contact an ETL, and another N-doping layer may be in the EML.

The composition and thicknesses of the N-doping layers in FIGS. 2 and 3 may be the same as described above. For example, the N-doping layers illustrated in FIGS. 2 and 3 may be prepared and included in the OLED as described above.

According to an embodiment, the organic light-emitting device may be included in various types of flat panel display devices, e.g., in a passive matrix organic light-emitting display device or in an active matrix organic light-emitting display device. For example, when the organic light-emitting device is included in an active matrix organic light-emitting display device including a thin-film transistor, the first electrode on the substrate may function as a pixel electrode, electrically connected to a source electrode or a drain electrode of the thin-film transistor. Moreover, the organic light-emitting device may also be included in a flat panel display device having a double-sided screen.

In an implementation, the organic layer of the organic light-emitting device may be formed of a suitable material by using a deposition method or may be formed using a wet method of coating a solution of a suitable material.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Example 1

To manufacture an anode, a corning 15 Ω/cm² (1,200 Å) ITO glass substrate was cut to a size of 50 mm×50 mm×0.7 mm and then sonicated in isopropyl alcohol and pure water each for five minutes, and then cleaned by irradiation of ultraviolet rays for 30 minutes and exposure to ozone. The resulting glass substrate was loaded into a vacuum deposition device.

Then, 2-TNATA, which is a HIL material, was vacuum-deposited on the glass substrate to form a HIL having a thickness of about 600 Å. Then, 4,4'-bis[N-(1-naphthyl)-N-phenylamino]biphenyl (NPB), which is a hole transporting compound, was vacuum-deposited on the HIL to form a HTL having a thickness of about 300 Å.

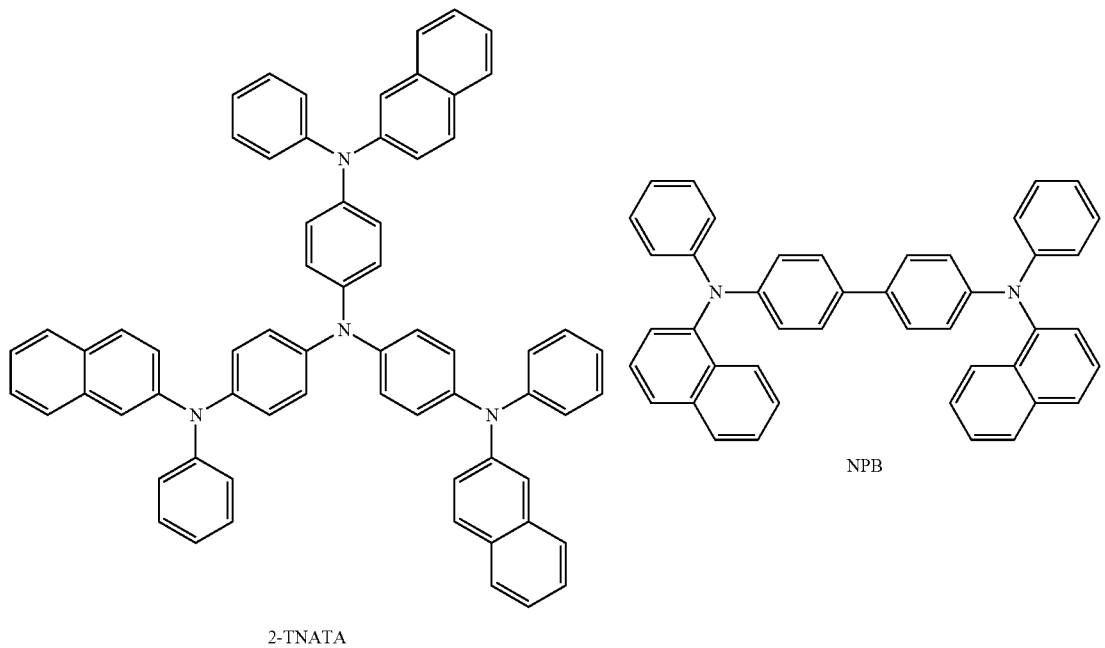

2-TNATA

NPB

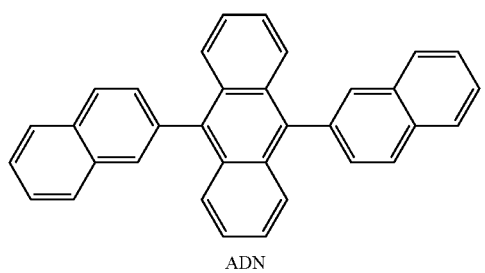

ADN

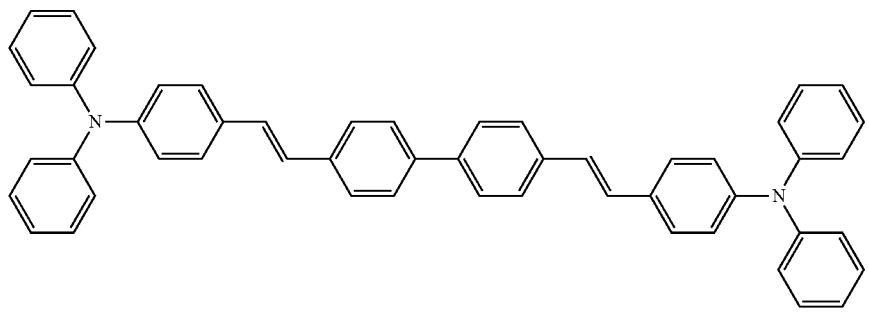

DPAVBi

A blue fluorescent host 9,10-di-naphthalene-2-yl-anthracene (ADN) and a blue fluorescent dopant, 4'-bis[2-(4-(N,N-diphenylamino)phenyl)vinyl]biphenyl 4,4-bis-(4-diphenylvinyl)biphenyl (DPAVBi), were co-deposited on the HTL in a weight ratio of 98:2 to form an EML having a thickness of about 300 Å.

A blue fluorescent host 9,10-di-naphthalene-2-yl-anthracene (ADN), a blue fluorescent dopant, 4'-bis[2-(4-(N,N-diphenylamino)phenyl)vinyl]biphenyl 4,4-bis-(4-diphenylvinyl)biphenyl (DPAVBi), and LiQ as an N-dopant were co-deposited on the EML in a weight ratio of 87:3:10 to form an N-doping layer having a thickness of about 50 Å.

Then, $Alq_3$ was deposited on the N-doping layer to form an ETL having a thickness of 300 Å, and then LiF as a halogenated alkali metal was deposited on the ETL to form an EIL having a thickness of 10 Å. Then, Al was vacuum-deposited on the EIL to form a cathode having a thickness of 3,000 Å, thereby forming an LiF/Al electrode and completing the manufacture of an organic light-emitting device.

The organic light-emitting device had a driving voltage of about 4.4 V at a current density of 50 $mA/cm^2$, a luminance of 3.7 $cd/m^2$, a luminescent efficiency of 4.0 cd/A, and a half life-span (hr @100 $mA/cm^2$) of about 1,600 hours.

Comparative Example 1

An organic light-emitting device was manufactured in the same manner as in Example 1, except that the N-doping layer formed on the EM1 layer by the co-deposition of ADN as a blue phosphorescent host, DPAVBi as a blue phosphorescent dopant, and LiQ as an N-dopant in Example 1 was not formed.

The organic light-emitting device had a driving voltage of about 4.1 V at a current density of 50 $mA/cm^2$, a luminance of 3.3 $cd/m^2$, a luminescent efficiency of 3.6 cd/A, and a half life-span (hr @100 $mA/cm^2$) of about 1,000 hours.

The organic light-emitting device of Example 1, including the EML also having a hole blocking function, was improved in efficiency and lifetime, compared to the organic light-emitting device of Comparative Example 1. The main and lifetime characteristics of the organic light-emitting devices of Example 1 and Comparative Example 1 are shown in Table 1, below.

TABLE 1

| Example | Driving voltage (V) | Current density (mA/cm2) | Luminance (cd/m2) | Efficiency (cd/A) | Half life-span (hr @100 mA/cm2) |
|---|---|---|---|---|---|
| Example 1 | 4.4 | 50 | 3.7 | 40 | 1,600 |
| Comparative Example 1 | 4.1 | 50 | 3.3 | 3.6 | 1,000 |

As described above, according to an embodiment, an organic light-emitting device may include an N-doping layer for electron enrichment in an emission layer. Holes may be confined within the emission layer while injection and migration of electrons into the emission layer are allowed. Accordingly, the emission layer, including red, green, and blue emission layers, may have improved efficiency and improved lifetime.

The embodiments may provide an organic light-emitting device including an emission layer that serves as both an emission layer and a hole blocking layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:
a first electrode;
a second electrode; and
an organic layer between the first electrode and the second electrode,
wherein the organic layer includes an emission layer, the emission layer including at least one N-doping layer, and
wherein the organic layer further includes an electron transport layer, the at least one N-doping layer contacting the electron transport layer.

2. The organic light-emitting device as claimed in claim 1, wherein the emission layer includes a host and a dopant, the dopant of the emission layer being different from a dopant of the at least one N-doping layer.

3. The organic light-emitting device as claimed in claim 1, wherein a dopant of the at least one N-doping layer includes a boron-based compound.

4. The organic light-emitting device as claimed in claim 1, wherein a dopant of the at least one N-doping layer includes lithium quinolate.

5. The organic light-emitting device as claimed in claim 1, wherein the at least one N-doping layer has a thickness of about 20 Å to about 100 Å.

6. The organic light-emitting device as claimed in claim 1, wherein:
the organic layer includes the emission layer and further includes a hole injection layer, a hole transport layer, or a functional layer having both hole injection and hole transport capabilities, and
the emission layer includes red, green, blue, and white emission layers, one of which includes a phosphorescent compound.

7. The organic light-emitting device as claimed in claim 6, wherein at least one of the hole injection layer, the hole transport layer, or the functional layer having both hole injection and hole transport capabilities includes a charge-generating material.

8. The organic light-emitting device as claimed in claim 7, wherein the charge-generating material includes a p-type dopant.

9. The organic light-emitting device as claimed in claim 8, wherein the p-type dopant includes a quinone derivative.

10. The organic light-emitting device as claimed in claim 8, wherein the p-type dopant includes a metal oxide.

11. The organic light-emitting device as claimed in claim 8, wherein the p-type dopant includes a cyano group-containing compound.

12. The organic light-emitting device as claimed in claim 1, wherein the organic layer further includes an electron transport layer, the electron transport layer including an electron transporting organic compound and a metal complex.

13. The organic light-emitting device as claimed in claim 12, wherein the metal complex includes a lithium complex.

14. The organic light-emitting device as claimed in claim 12, wherein the metal complex includes lithium quinolate.

15. The organic light-emitting device as claimed in claim 12, wherein the metal complex includes a complex represented by Compound 203, below:

<Compound 203>

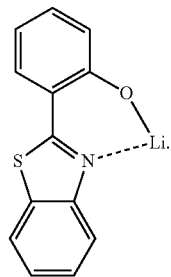

16. The organic light-emitting device as claimed in claim 1, wherein the organic layer is formed using a wet process.

17. A flat panel display device comprising the organic light-emitting device as claimed in claim 1, wherein the first electrode of the organic light-emitting device is electrically connected to a source electrode or a drain electrode of a thin-film transistor.

18. An organic light-emitting device, comprising:
a first electrode;
a second electrode; and
an organic layer between the first electrode and the second electrode,
wherein the organic layer includes an emission layer, the emission layer including at least one N-doping layer, and
wherein:
the organic layer further includes an electron transport layer and a hole transport layer,
the emission layer includes two N-doping layers,
one of the N-doping layers contacts the electron transport layer, and
another N-doping layer is in the emission layer.

19. An organic light-emitting device, comprising:
a first electrode;
a second electrode; and
an organic layer between the first electrode and the second electrode,
wherein the organic layer includes an emission layer, the emission layer including at least one N-doping layer, and
wherein the emission layer includes a host and a dopant, the dopant of the emission layer being the same as or different from a dopant of the at least one N-doping layer.

20. The organic light-emitting device as claimed in claim 19, wherein the organic layer further includes an electron transport layer, the at least one N-doping layer contacting the electron transport layer.

* * * * *